US011011529B2

(12) United States Patent
Ramaswamy

(10) Patent No.: US 11,011,529 B2
(45) Date of Patent: May 18, 2021

(54) MEMORY ARRAYS COMPRISING VERTICALLY-ALTERNATING TIERS OF INSULATIVE MATERIAL AND MEMORY CELLS AND METHODS OF FORMING A MEMORY ARRAY COMPRISING MEMORY CELLS INDIVIDUALLY COMPRISING A TRANSISTOR AND A CAPACITOR

(71) Applicant: Micron Technology, inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/016,809

(22) Filed: Jun. 25, 2018

(65) Prior Publication Data
US 2019/0006376 A1    Jan. 3, 2019

Related U.S. Application Data

(60) Provisional application No. 62/526,843, filed on Jun. 29, 2017.

(51) Int. Cl.
*H01L 27/11529* (2017.01)
*H01L 27/11524* (2017.01)
(Continued)

(52) U.S. Cl.
CPC ...... *H01L 27/11514* (2013.01); *H01L 23/528* (2013.01); *H01L 27/0688* (2013.01);
(Continued)

(58) Field of Classification Search
CPC ......... H01L 27/11556; H01L 27/11524; H01L 27/11529; H01L 27/11582; H01L 27/1157
See application file for complete search history.

(56) References Cited

U.S. PATENT DOCUMENTS 9,236,128 B1 * 1/2016 Louie ................. H01L 27/1157
2007/0012995 A1 * 1/2007 Park .................. H01L 29/66795
257/328

(Continued)

FOREIGN PATENT DOCUMENTS

EP     18824391     5/2020
TW     107122392    9/2019
(Continued)

*Primary Examiner* — Allen L Parker
*Assistant Examiner* — Gustavo G Ramallo
(74) *Attorney, Agent, or Firm* — Wells St. John P.S.

(57) ABSTRACT

A memory array comprises vertically-alternating tiers of insulative material and memory cells, with the memory cells individually comprising a transistor comprising first and second source/drain regions having a channel region there-between and a gate operatively proximate the channel region. At least a portion of the channel region is horizontally-oriented for horizontal current flow in the portion between the first and second source/drain regions. A capacitor of the memory cell comprises first and second electrodes having a capacitor insulator there-between. The first electrode is electrically coupled to the first source/drain region. A horizontal longitudinally-elongated sense line is in individual of the memory-cell tiers. Individual of the second source/drain regions of individual of the transistors that are in the same memory-cell tier are electrically coupled to the horizontal longitudinally-elongated sense line in that individual tier of memory cells. A capacitor-electrode structure extends elevationally through the vertically-alternating tiers. Individual of the second electrodes of individual of the capacitors are electrically coupled to the elevationally-extending capacitor-electrode structure. An access-line pillar extends elevationally through the vertically-alternating tiers. The gate of individual of the transistors in different of the memory-cell tiers comprises a portion of the elevationally- (Continued)

extending access-line pillar. Other embodiments, including method, are disclosed.

24 Claims, 34 Drawing Sheets

(51) Int. Cl.
| | |
|---|---|
| H01L 27/1157 | (2017.01) |
| H01L 27/11514 | (2017.01) |
| H01L 27/108 | (2006.01) |
| H01L 23/528 | (2006.01) |
| H01L 29/10 | (2006.01) |
| H01L 29/08 | (2006.01) |
| H01L 49/02 | (2006.01) |
| H01L 27/11597 | (2017.01) |
| H01L 27/06 | (2006.01) |
| H01L 27/11556 | (2017.01) |
| H01L 27/11582 | (2017.01) |
| H01L 21/768 | (2006.01) |
| H01L 27/11507 | (2017.01) |
| H01L 27/11504 | (2017.01) |
| H01L 27/11587 | (2017.01) |
| H01L 27/1159 | (2017.01) |
| H01L 21/311 | (2006.01) |
| H01L 21/02 | (2006.01) |

(52) U.S. Cl.
CPC .... *H01L 27/1085* (2013.01); *H01L 27/10805* (2013.01); *H01L 27/10873* (2013.01); *H01L 27/10882* (2013.01); *H01L 27/1157* (2013.01); *H01L 27/11524* (2013.01); *H01L 27/11529* (2013.01); *H01L 27/11556* (2013.01); *H01L 27/11582* (2013.01); *H01L 27/11597* (2013.01); *H01L 28/60* (2013.01); *H01L 28/90* (2013.01); *H01L 29/0847* (2013.01); *H01L 29/1037* (2013.01); *H01L 21/02164* (2013.01); *H01L 21/31111* (2013.01); *H01L 21/76802* (2013.01); *H01L 21/76877* (2013.01); *H01L 27/1159* (2013.01); *H01L 27/11504* (2013.01); *H01L 27/11507* (2013.01); *H01L 27/11587* (2013.01)

(56) References Cited

U.S. PATENT DOCUMENTS

| | | | |
|---|---|---|---|
| 2008/0061370 A1* | 3/2008 | Matsuo | H01L 29/41791 257/347 |
| 2009/0097321 A1 | 4/2009 | Kim et al. | |
| 2010/0038719 A1 | 2/2010 | Kim et al. | |
| 2013/0070506 A1* | 3/2013 | Kajigaya | G11C 7/18 365/51 |
| 2013/0153851 A1* | 6/2013 | Park | H01L 43/08 257/4 |
| 2014/0054538 A1 | 2/2014 | Park et al. | |
| 2015/0318296 A1* | 11/2015 | Kim | H01L 27/1157 257/296 |
| 2017/0053906 A1 | 2/2017 | Or-Bach et al. | |

FOREIGN PATENT DOCUMENTS

| | | |
|---|---|---|
| WO | PCT/US2018/039246 | 10/2016 |
| WO | PCT/US2018/039246 | 10/2018 |
| WO | PCT/US2018/039246 | 12/2019 |

* cited by examiner

MEMORY ARRAYS COMPRISING VERTICALLY-ALTERNATING TIERS OF INSULATIVE MATERIAL AND MEMORY CELLS AND METHODS OF FORMING A MEMORY ARRAY COMPRISING MEMORY CELLS INDIVIDUALLY COMPRISING A TRANSISTOR AND A CAPACITOR

TECHNICAL FIELD

Embodiments disclosed herein pertain to memory arrays comprising vertically-alternating tiers of insulative material and memory cells and to methods of forming a memory array comprising memory cells individually comprising a transistor and a capacitor.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Programmable materials other than ferroelectric materials may be used as a capacitor insulator to render capacitors non-volatile.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example reversibly programmable charge storage/trap regions as part of the gate construction between the gate insulator and the conductive gate.

One type of transistor is a ferroelectric field effect transistor (FeFET) wherein at least some portion of the gate construction (e.g., the gate insulator) comprises ferroelectric material. The two different polarized states of the ferroelectric material in field effect transistors may be characterized by different threshold voltage ($V_t$) for the transistor or by different channel conductivity for a selected operating voltage. Again, polarization state of the ferroelectric material can be changed by application of suitable programming voltages, and which results in one of high channel conductance or low channel conductance. The high and low conductance, invoked by the ferroelectric polarization state, remains after removal of the gate programming voltage (at least for a time). The status of the channel can be read by applying a small drain voltage which does not disturb the ferroelectric polarization. Programmable materials other than ferroelectric materials may be used as a gate insulator to render a transistor to be non-volatile.

DETAILED DESCRIPTION OF EXAMPLE EMBODIMENTS

Embodiments of the invention encompass memory arrays and methods of forming memory arrays. A first example structure embodiment of an example memory array is shown in and described with reference to FIGS. 1-3. Such includes a substrate structure or construction 8 comprising a memory array 10 fabricated relative to a base substrate 11 (shown in FIG. 3 only). Example base substrate 11 may comprise any one or more of conductive/conductor/conducting (i.e., electrically herein), semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 1:
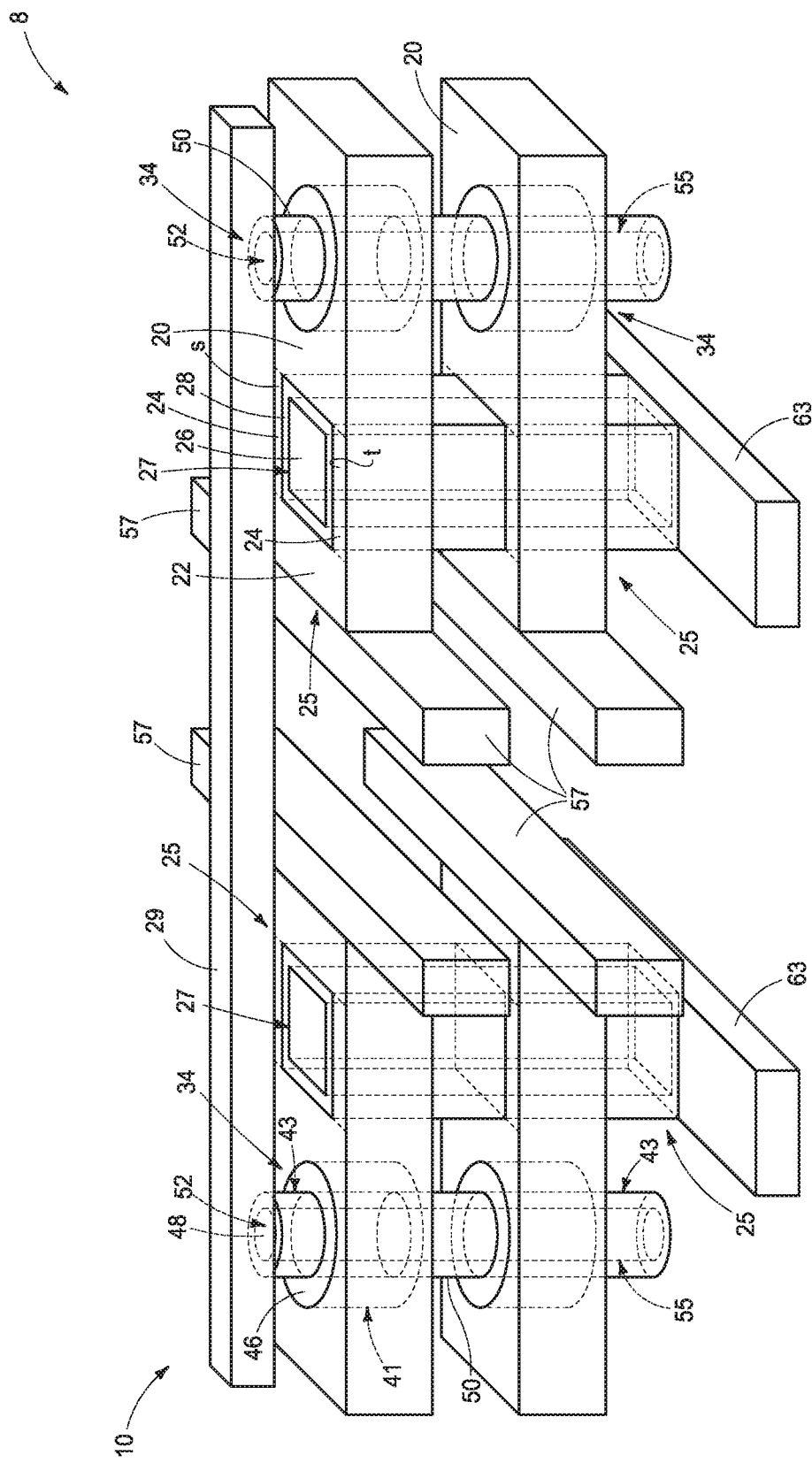
FIG. 1 is a diagrammatic perspective view of a portion of a substrate fragment comprising a memory array in accordance with an embodiment of the invention.
Figure 2:
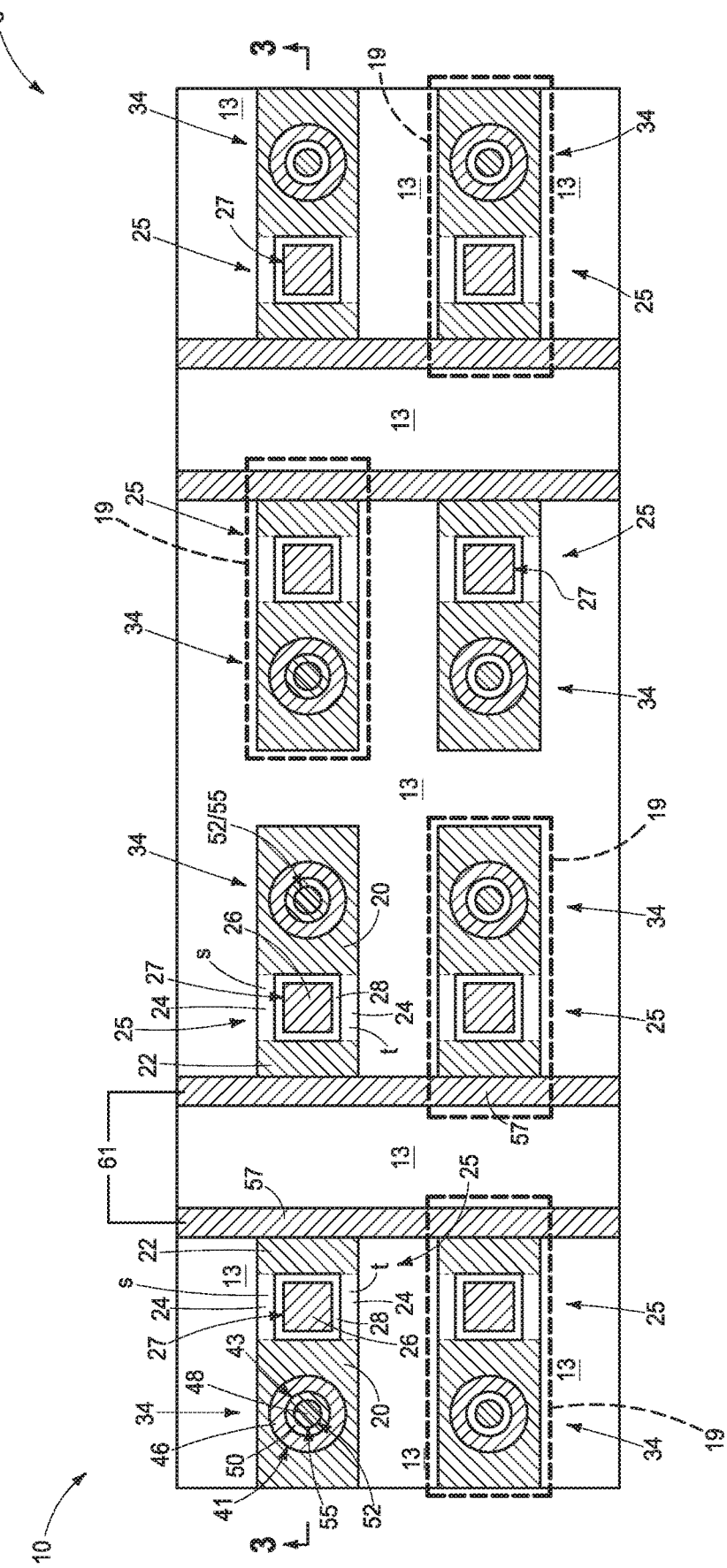
FIG. 2 is a more complete sectional view of the FIG. 1 substrate fragment, and is taken through line 2-2 in FIG. 3.
Figure 3:
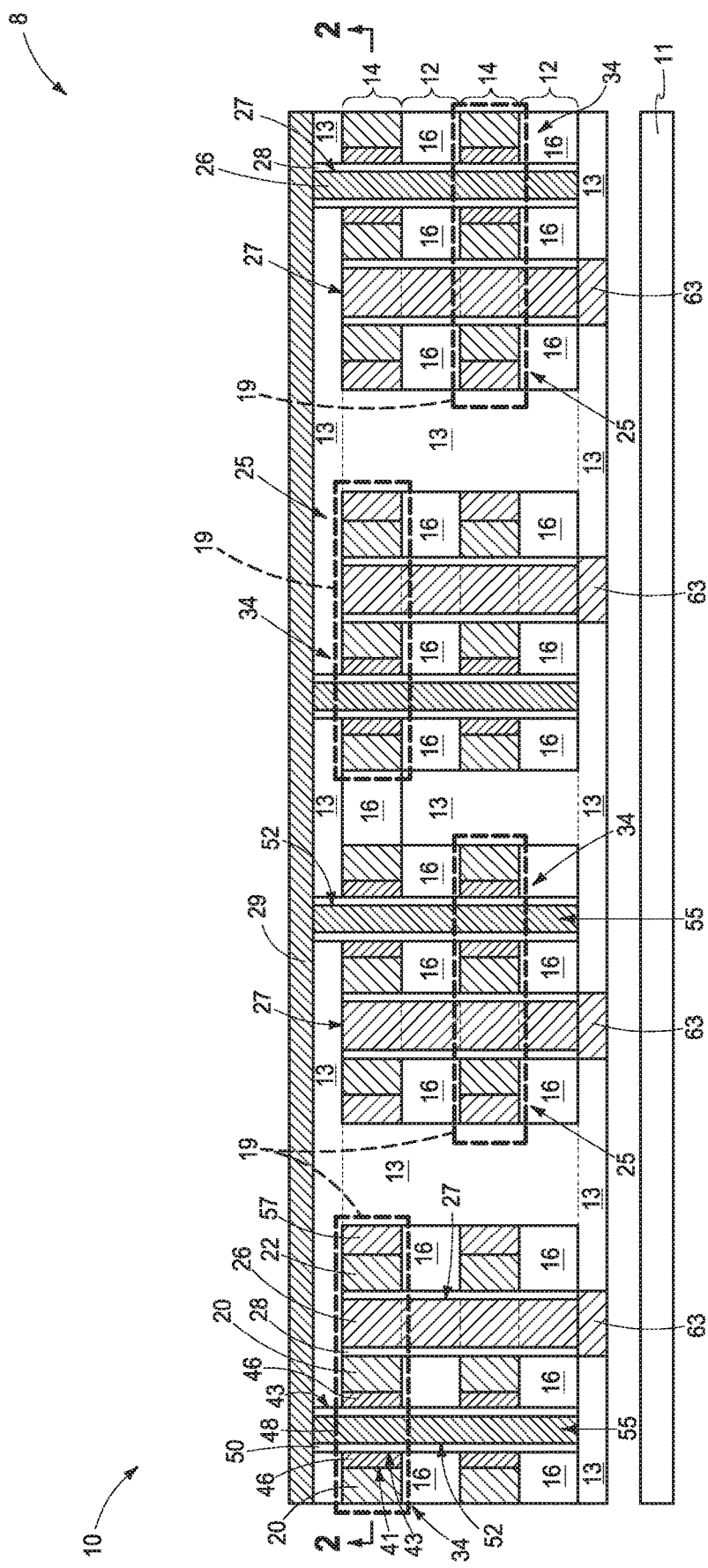
FIG. 3 is a sectional view taken through line 3-3 in FIG. 2.
Figure 4:
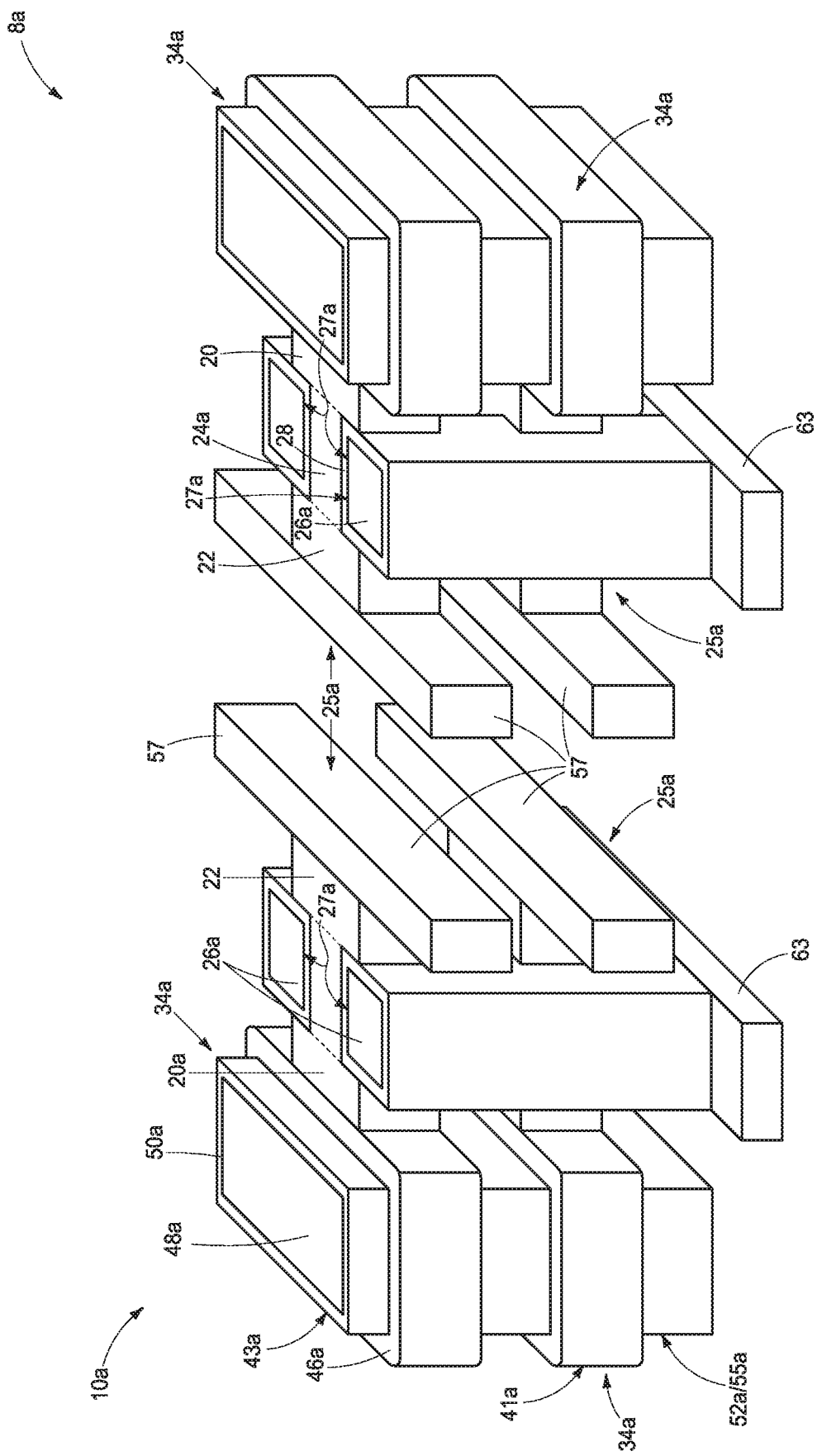
FIG. 4 is a diagrammatic perspective view of a portion of a substrate fragment comprising a memory array in accordance with an embodiment of the invention.
Figure 5:
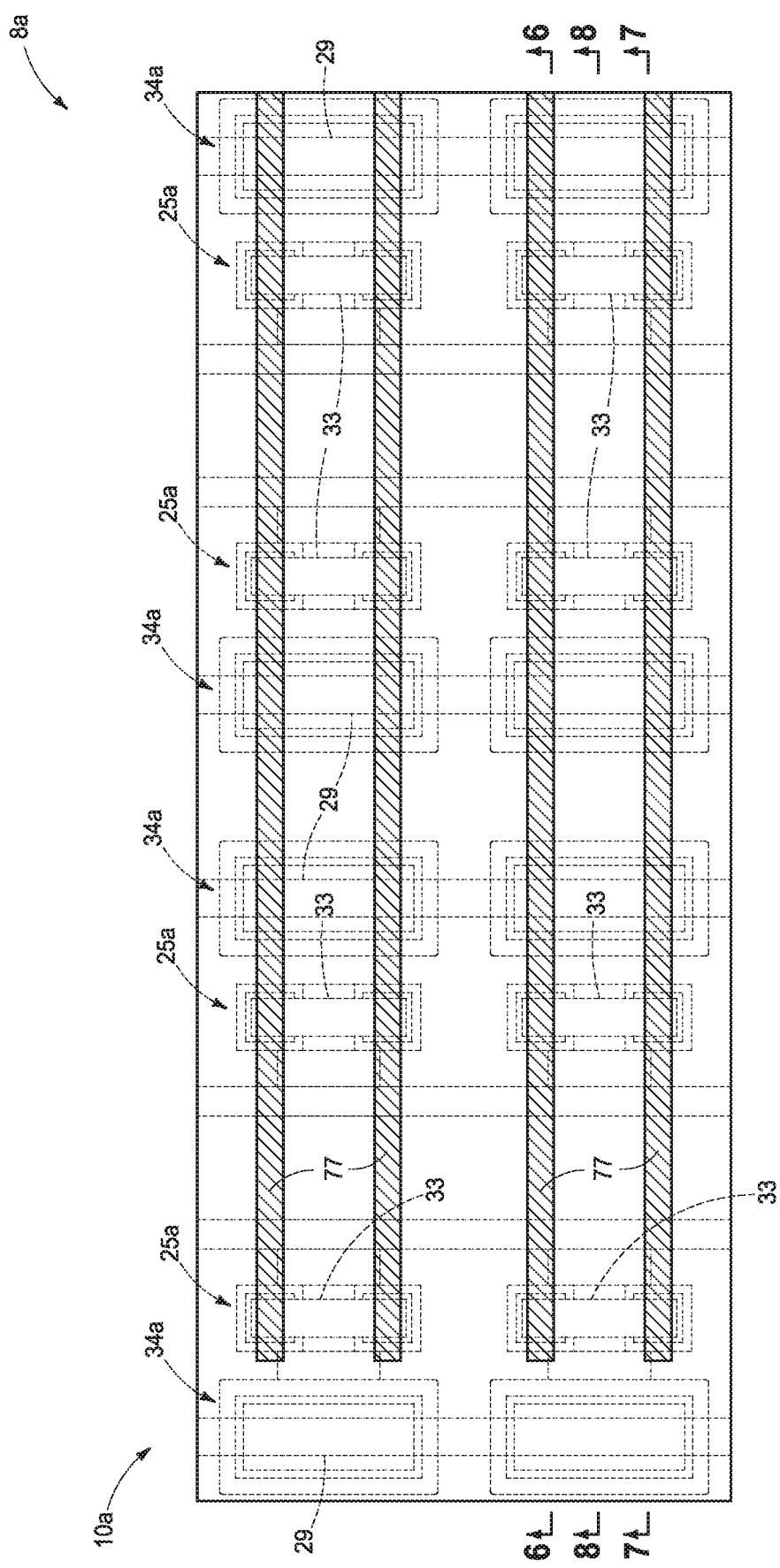
FIG. 5 is a more complete sectional view of the FIG. 4 substrate fragment, and is taken through line 5-5 in FIGS. 6, 7, and 8.
Figure 6:
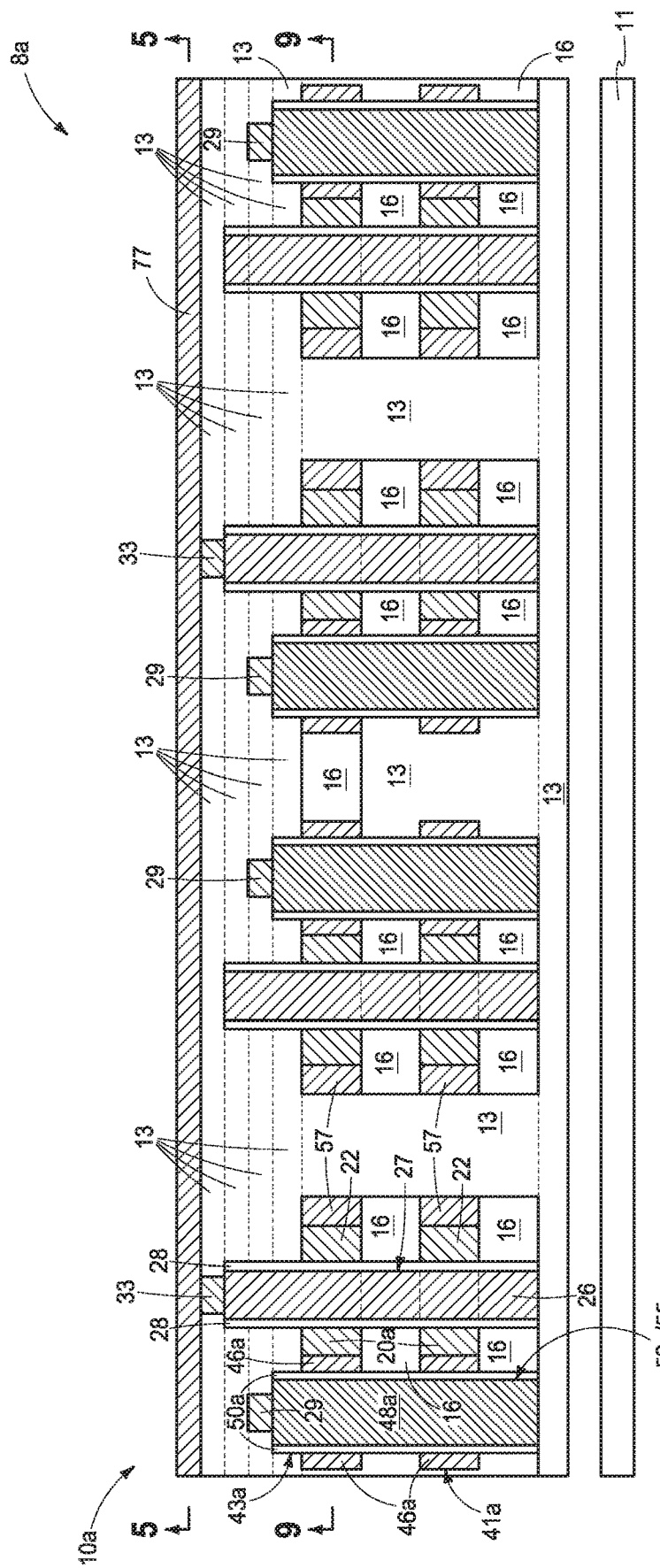
FIG. 6 is a sectional view taken through line 6-6 in FIGS. 5 and 9.
Figure 7:
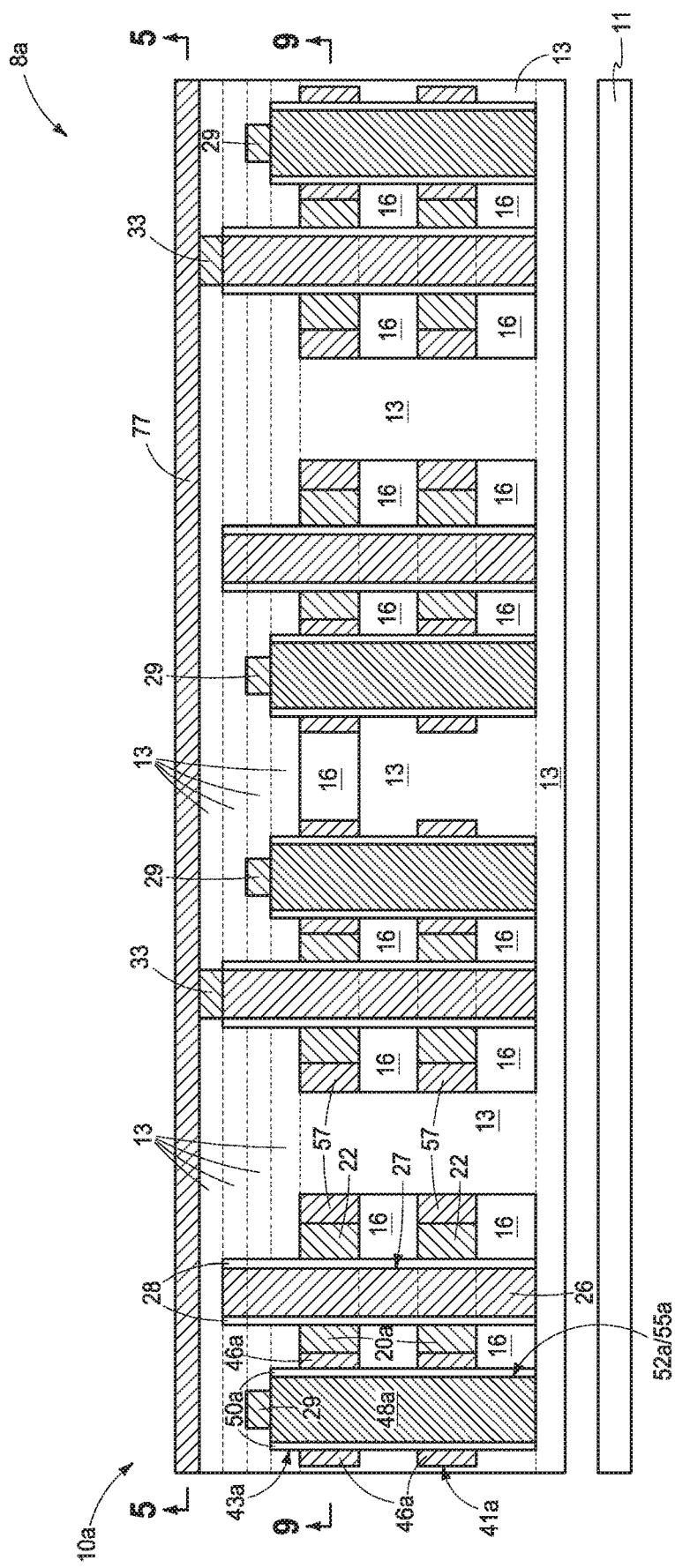
FIG. 7 is a sectional view taken through line 7-7 in FIGS. 5 and 9.
Figure 8:
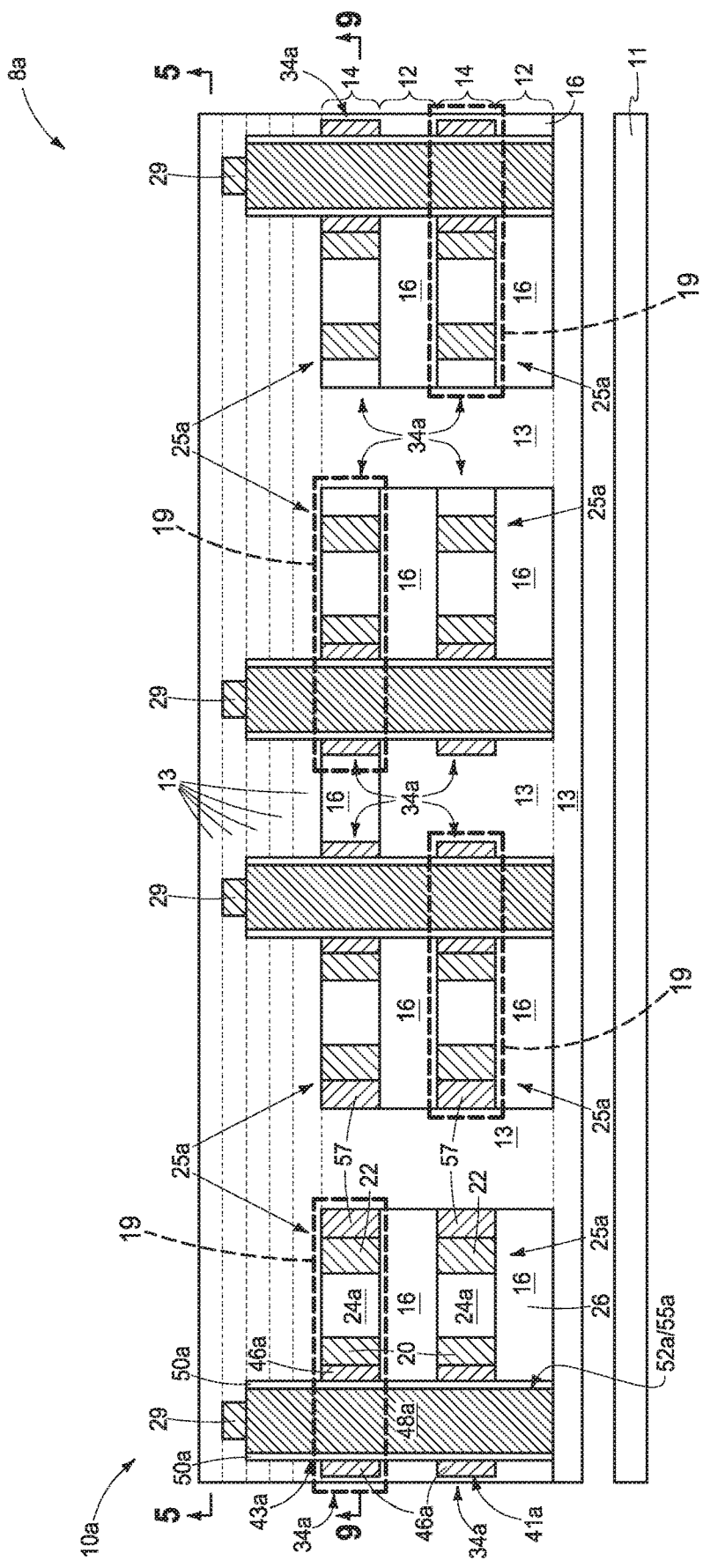
FIG. 8 is a sectional view taken through line 8-8 in FIGS. 5 and 9.
Figure 9:
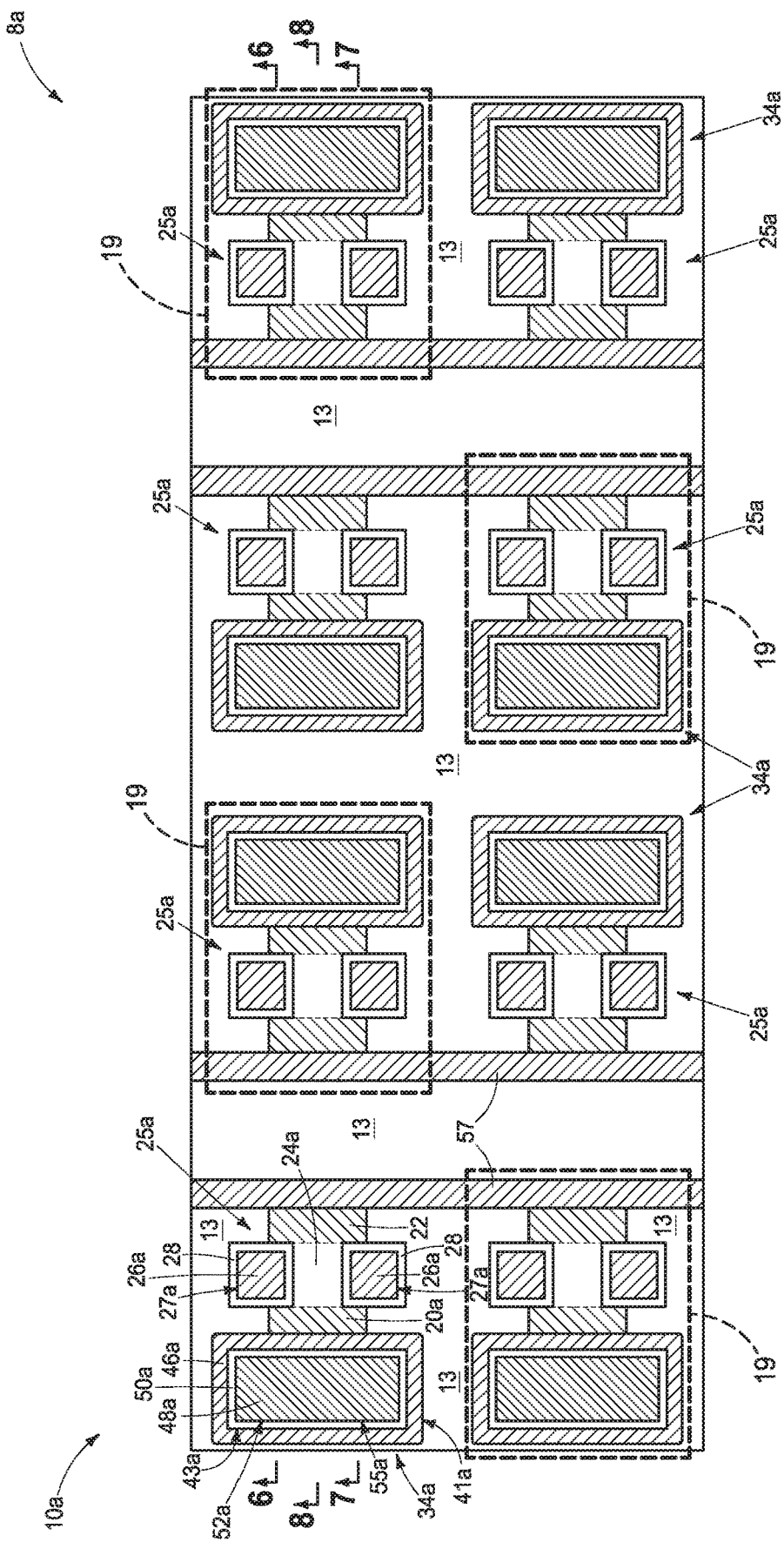
FIG. 9 is a sectional view taken through line 9-9 in FIGS. 6, 7, and 8.

Construction 8 includes vertically-alternating tiers 12 and 14 of insulative material 16 (e.g., comprising, consisting essentially of, or consisting of silicon nitride and/or doped or undoped silicon dioxide of a thickness of 200 Angstroms to 1,000 Angstroms) and memory cells 19, respectively. Only four memory cell outlines 19 are shown in FIGS. 2 and 3 for clarity, although eight memory cells are visible in FIGS. 2 and 3 and four in FIG. 1. Only two z-axis columns of memory cells are shown in FIG. 1, and isolating insulative/insulating material is not shown to assist the reader and provide better clarity as to horizontal and vertical layout of certain operative components. In some embodiments, tiers 14 may be considered as transistor-material tiers 14. Memory-cell tiers 14 may be of the same or different thickness as that of insulative material tiers 12, with the same thickness being shown. Construction 8 is shown as having four vertically-alternating tiers 12 and 14 (FIG. 3), although fewer or likely many more (e.g., dozens, hundreds, etc.) may be formed. Accordingly, more tiers 12 and 14 may be below the depicted tiers and above base substrate 11 and/or more tiers 12 and 14 may be above the depicted tiers. Insulating material 13 (e.g., the other of silicon nitride or silicon dioxide where insulative material 16 is one of silicon nitride or silicon dioxide) is horizontally between memory cells 19 and extends elevationally through the depicted stack of materials.

Memory cells 19 individually comprise a transistor 25 and a capacitor 34. Transistor 25 comprises a first source/drain region 20 and a second source/drain region 22 (e.g., conductively-doped semiconductor material such as polysilicon or semiconductively-doped semiconductor material such as polysilicon for each) having a channel region 24 therebetween (e.g., doped semiconductor material, such as polysilicon, but not to be intrinsically conductive). In some embodiments (but not shown), a conductively-doped semiconductor region and/or or another semiconductive region (e.g., LDD and/or halo regions) may be between channel region 24 and one or both of source/drain regions 20 and 22.

A gate 26 (e.g., one or more of elemental metal, a mixture or alloy of two or more elementals, conductive metal compounds, and conductively-doped semiconductive materials) is operatively proximate channel region 24. Specifically, in the depicted example, a gate insulator material 28 (e.g., silicon dioxide, silicon nitride, hafnium oxide, other high k insulator material, and/or ferroelectric material) is between gate 26 and channel region 24. In one embodiment and as shown, channel region 24 comprises two channel-region segments "s" and "t" on opposite sides (e.g., y-direction sides) of the gate in a straight-line horizontal cross-section (e.g., the cross-section shown by FIG. 2). Alternately in another embodiment, the channel region may be on only one side (not shown in FIGS. 1-3) of gate 26 in a straight-line horizontal cross-section. Regardless, at least a portion of channel region 24 is horizontally-oriented for horizontal current flow in the portion between first source/drain region 20 and second source/drain region 22. In the depicted example embodiment, all of channel region 24 is horizontally-oriented for horizontal current flow there-through. Regardless, when suitable voltage is applied to gate 26, a conductive channel can form within channel region 24 proximate gate insulator material 28 such that current is capable of flowing between source/drain regions 20 and 22.

First source/drain region 20 and second source/drain region 22 are each shown as abutting directly against all of gate insulator material 28 in the x-axis direction (FIG. 2). Alternately, one or both may be spaced (not shown) from all or some of gate insulator material 28 in the x-axis direction and material of channel region 24 may extend along all or some (neither being shown) of gate insulator material 28 in the x-axis direction. Regardless, in one embodiment, channel region 24 completely encircles (not shown) gate 26 and may be of the same or different horizontal thicknesses in the x-direction and the y-direction.

In one embodiment and as shown, an access-line pillar 27 extends elevationally through vertically-alternating tiers 12 and 14 (e.g., in the z-axis direction), and gate 26 of individual transistors 25 in different memory-cell tiers 14 comprises a portion of elevationally-extending access-line pillar 27. Access-line pillar 27 may interconnect multiple gates 26 along that access-line pillar. In one embodiment and as shown, access-line pillar 27 extends vertically or within 10° of vertical. Regardless, in one embodiment and as shown, individual access-line pillars 27 are directly electrically coupled to a horizontal longitudinally-elongated access-line 63 that is above or below (below being shown) vertically-alternating tiers 12 and 14.

Capacitor 34 comprises a pair of electrodes, for example a first electrode 46 and a second electrode 48 (e.g., conductively-doped semiconductive material and/or metal material for each), having a capacitor insulator 50 there-between (e.g., silicon dioxide, silicon nitride, hafnium oxide, other high k insulator material and/or ferroelectric material). First electrode 46 is electrically coupled, in one embodiment directly electrically coupled, to first source/drain region 20 of transistor 25. Additionally, in one embodiment, first electrode 46 comprises an annulus 41 in a straight-line horizontal cross-section (e.g., the cross-section shown by FIG. 2). Regardless, first electrode 46 and first source/drain region 20 may be integral (i.e., being of the same material, structurally indistinguishable from one another, and not shown). Capacitor insulator 50 is radially inward of first-electrode annulus 41, in one embodiment extends elevationally through vertically-alternating tiers 12 and 14, and regardless in one embodiment comprises an annulus 43 in a straight-line horizontal cross-section (e.g., the cross-section shown by FIG. 2). Second electrode 48 is radially inward of capacitor insulator 50, and in one embodiment as shown is not annular in any straight-line horizontal cross-section.

A capacitor-electrode structure 52 (e.g., a solid or hollow pillar, a solid or hollow wall, etc.) extends elevationally through vertically-alternating tiers 12 and 14, with individual second electrodes 48 of individual capacitors 34 that are in different memory-cell tiers 14 being electrically coupled, in one embodiment directly electrically coupled, to elevationally-extending capacitor-electrode structure 52. In one embodiment and as shown, second electrode 48 of individual capacitors 34 comprises a portion of elevationally-extending capacitor-electrode structure 52. In one embodiment and as shown, capacitor-electrode structure 52 is not annular in any straight-line horizontal cross-section, and in one embodiment extends vertically or within 10° of vertical. Example materials for capacitor-electrode structure 52 are metal materials and conductively-doped semiconductor material. In one embodiment and as shown, capacitor-electrode structure 52 comprises a pillar 55, with capacitor insulator 50 being received circumferentially about structure 52/pillar 55. In one embodiment, such, by way of example only, is one example of how second capacitor electrodes 48 of multiple capacitors 34 that are in different memory-cell tiers 14 in the array may be electrically coupled with one another. In one embodiment and as shown, capacitor-electrode structure 52 is directly electrically coupled to a horizontally-elongated capacitor-electrode structure 29 (e.g., a line or a plate, for example as shown in FIGS. 1 and 3) that is above or below (above being shown) vertically-alternating tiers 12 and 14. Construction(s) 29 may, in one embodiment, directly electrically couple together all second electrodes 48 within the array. Construction 29 is shown as a single line for clarity in FIG. 1. The above and below positions of construction 29 and lines 63 (e.g., global access lines) relative to tiers 12 and 14 may be reversed or both may be above or both may be below tiers 12 and 14.

A sense line is electrically coupled, in one embodiment directly electrically coupled, to multiple of the second source/drain regions. In one embodiment, the multiple second source/drain regions that are electrically coupled to the sense line are in the same memory-cell tier. In one example such embodiment, a horizontal longitudinally-elongated sense line 57 is in individual memory-cell tiers 14, with individual second source/drain regions 22 of individual transistors 25 that are in the same memory-cell tier being electrically coupled, in one embodiment directly electrically coupled, thereto in that individual memory-cell tier 14. In one embodiment, sense-line 57 comprises a peripheral conductively-doped semiconductive material (e.g., polysilicon, and not shown) and a central metal-material core (e.g., TiN and/or W, and not shown).

FIGS. 1-3 show an example embodiment comprising a pair of laterally-spaced sense lines 57 between two gates 26 of immediately-laterally-adjacent different transistors 25. Such may be formed in accordance with an example method embodiment, as described below. Regardless, in one such structural embodiment, sense lines 57 in such individual pairs of sense lines 57 may be electrically coupled together, in one embodiment directly electrically coupled, as shown schematically by an interconnect line 61 (FIG. 2). Alternately, such sense lines may not be so electrically coupled together (not shown) and controlled separately. Still alternately, only a single sense line (not shown) may be substituted for the depicted individual pairs of sense lines 57.

In the above-described embodiment, the multiple second source/drain regions 22 that are electrically coupled to the sense line are in the same memory-cell tier. Alternately, the multiple second source/drain regions that are electrically coupled to a particular sense line may be in different (not shown) memory-cell tiers 14. For example, and by way of example only, a sense-line structure (e.g., a solid or hollow pillar, a solid or hollow wall, etc., and not shown) may extend elevationally through vertically-alternating tiers 12 and 14, with individual second source/drain regions 22 of individual transistors 25 that are in different memory-cell tiers 14 being electrically coupled, in one embodiment directly electrically coupled, thereto.

An alternate embodiment construction 8*a* comprising a memory array 10*a* is next described with reference to FIGS. 4-9. Like numerals from the above-described embodiments have been used where appropriate, with some construction differences being indicated with the suffix "a" or with different numerals. The embodiment of FIGS. 4-9 differs in part from the embodiments described above with respect to FIGS. 1-3 in having another access-line pillar that extends elevationally through the vertically-alternating tiers, with the another access-line pillar comprising another gate of the individual transistors in the different memory-cell tiers. For example, transistor 25*a* of construction 8*a* comprises a pair of access-line pillars 27*a* extending elevationally through vertically-alternating tiers 12 and 14 on opposite sides (e.g., in the y-direction) of individual channel regions 24*a* that are in different memory-cell tiers 14. Portions of access-line pillars 27*a* in different memory-cell tiers 14 comprise a pair of gates 26*a* on opposite sides (e.g., in the y-direction) of individual channel regions 24*a* of individual transistors 25*a* in different memory-cell tiers 14. In one embodiment and as shown, construction 8*a* differs in part from construction 8 in not having two channel-region segments on opposite sides (e.g., in the y-direction) of a single gate in a straight-line horizontal cross-section.

In one embodiment and as shown, construction 8*a* comprises a horizontally-extending conductive strap 33 (FIGS. 5-7) that directly electrically couples the pair of access-line pillars 27*a* together in a single transistor 25*a*. In one such embodiment, conductive strap 33 is above the pair of access-line pillars 27*a*, and in another embodiment is below (not shown) the pair of access-line pillars 27*a*. In one embodiment and as shown, example construction 8*a* comprises a horizontal longitudinally-elongated conductive line 77 that is directly electrically coupled to conductive strap 33 of multiple pairs of access-line pillars 27*a*. Two conductive lines 77 are shown, each of which electrically couples together respective alternate conductive straps 33 (e.g., in the x-direction) for separately accessing/controlling alternate access-line pillars 27*a*. The above and below positions of construction 29 and lines 63 (e.g., global access lines) relative to tiers 12 and 14 may be reversed or both may be above or both may be below tiers 12 and 14.

Construction 8*a*, by way of example only, shows example alternate construction capacitors 34*a*. Such capacitor constructions 34*a* may be used in any other embodiments disclosed herein, and the capacitor construction 34 as shown and described in the embodiments with respect to FIGS. 1-3 may additionally or alternately be used. Example capacitor construction 34*a* is shown as being generally rectangular in horizontal cross-section. Additionally, capacitor construction 34 shown with respect to FIGS. 1-3 nowhere extends laterally or radially into peripheral insulating material 13, whereas capacitor construction 34*a* is shown projecting laterally or radially into insulating material 13. Additionally, constructions/lines 29 and lines 77 are shown to both be above tiers 12 and 14, although this may be reversed or one may be above and the other below tiers 12 and 14. Certain insulating/insulative materials, upper extending portions of structures 52*a* and 27*a*, and lines 29 and 77 are not shown in FIG. 1 for clarity with respect to the depicted components.

Any other attribute(s) or aspect(s) as shown and/or described herein with respect to other embodiments may be used in the embodiments of FIGS. 4-9.

Figure 10:
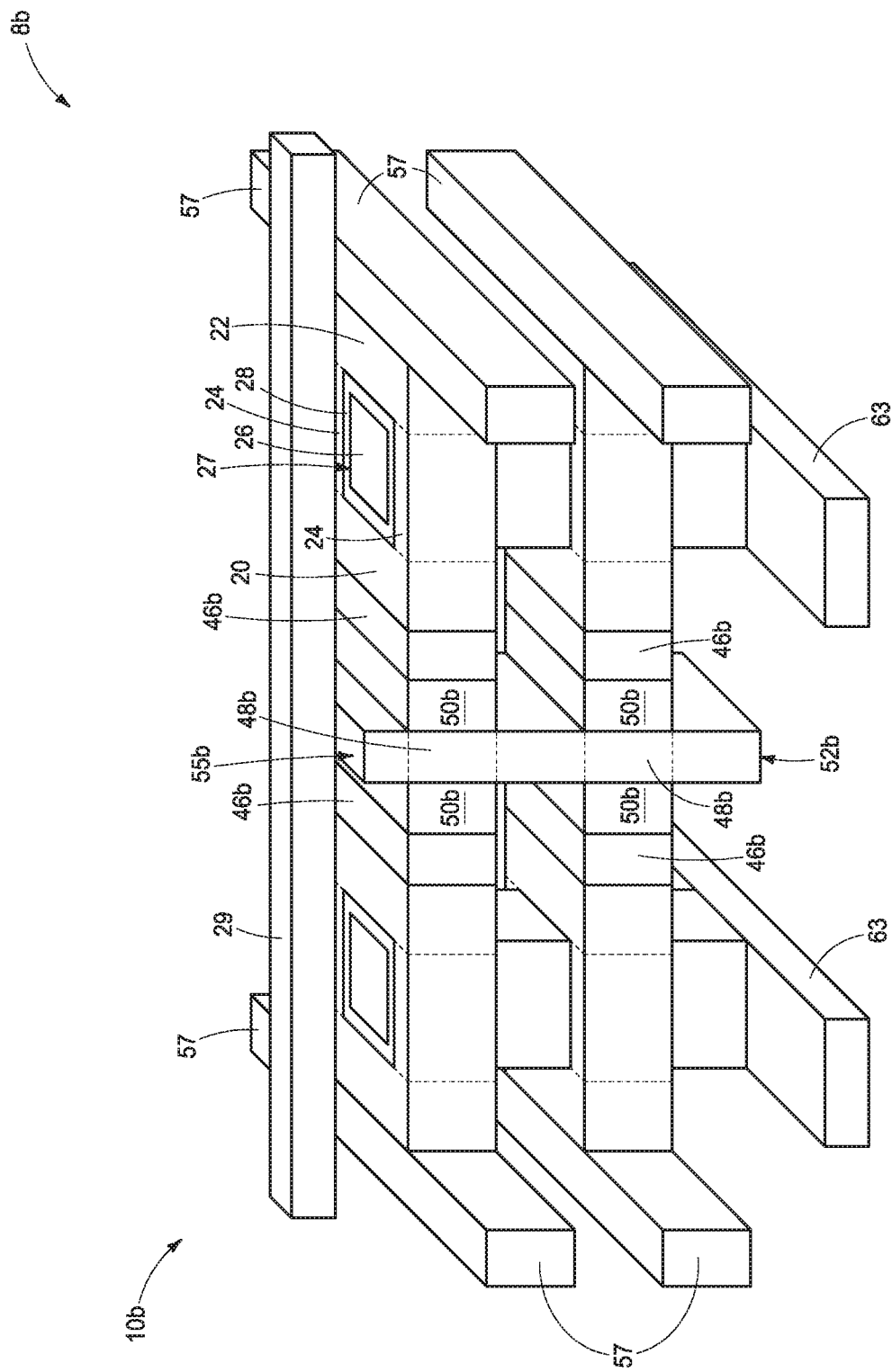
FIG. 10 is a diagrammatic perspective view of a portion of a substrate fragment comprising a memory array in accordance with an embodiment of the invention.
Figure 11:
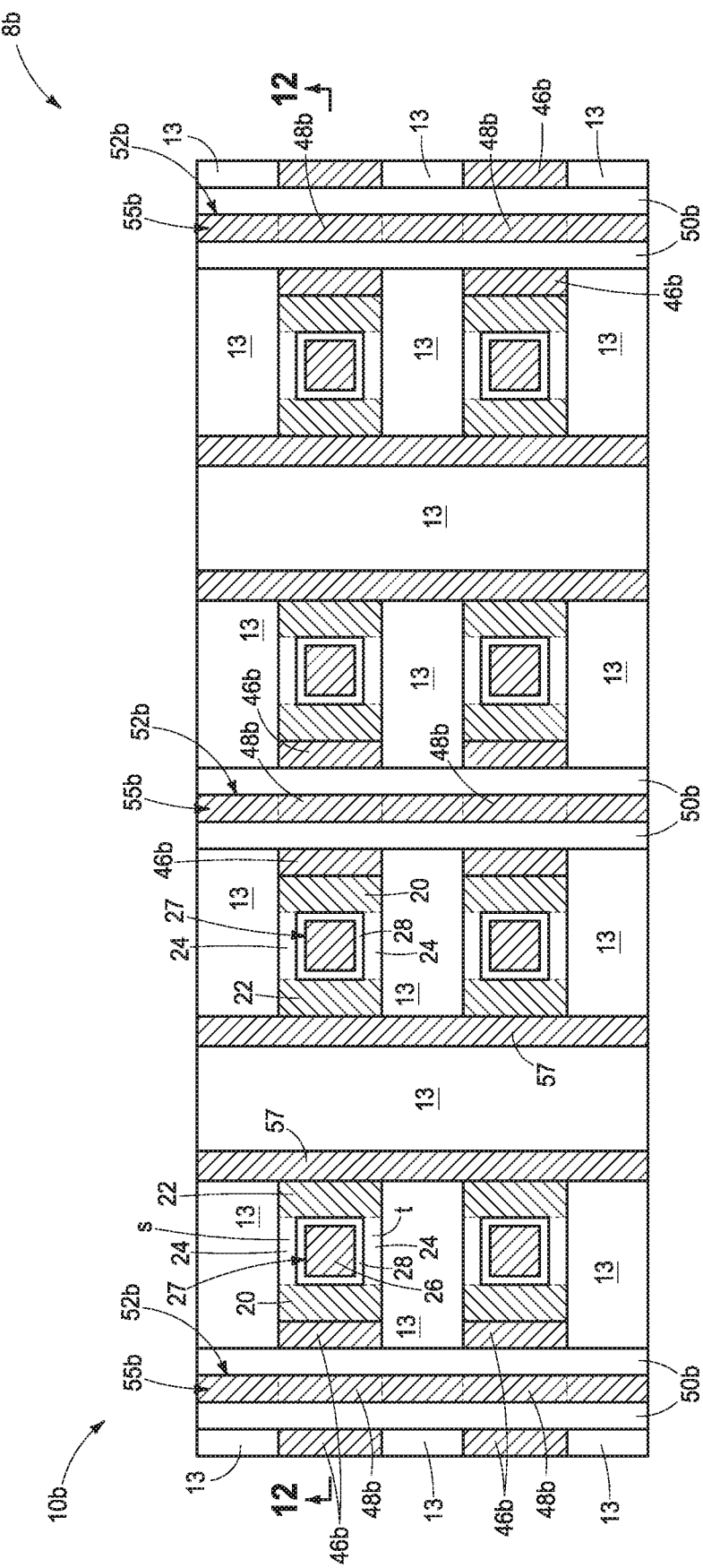
FIG. 11 is a more complete sectional view of the FIG. 10 substrate fragment, and is taken through line 11-11 in FIG. 12.
Figure 12:
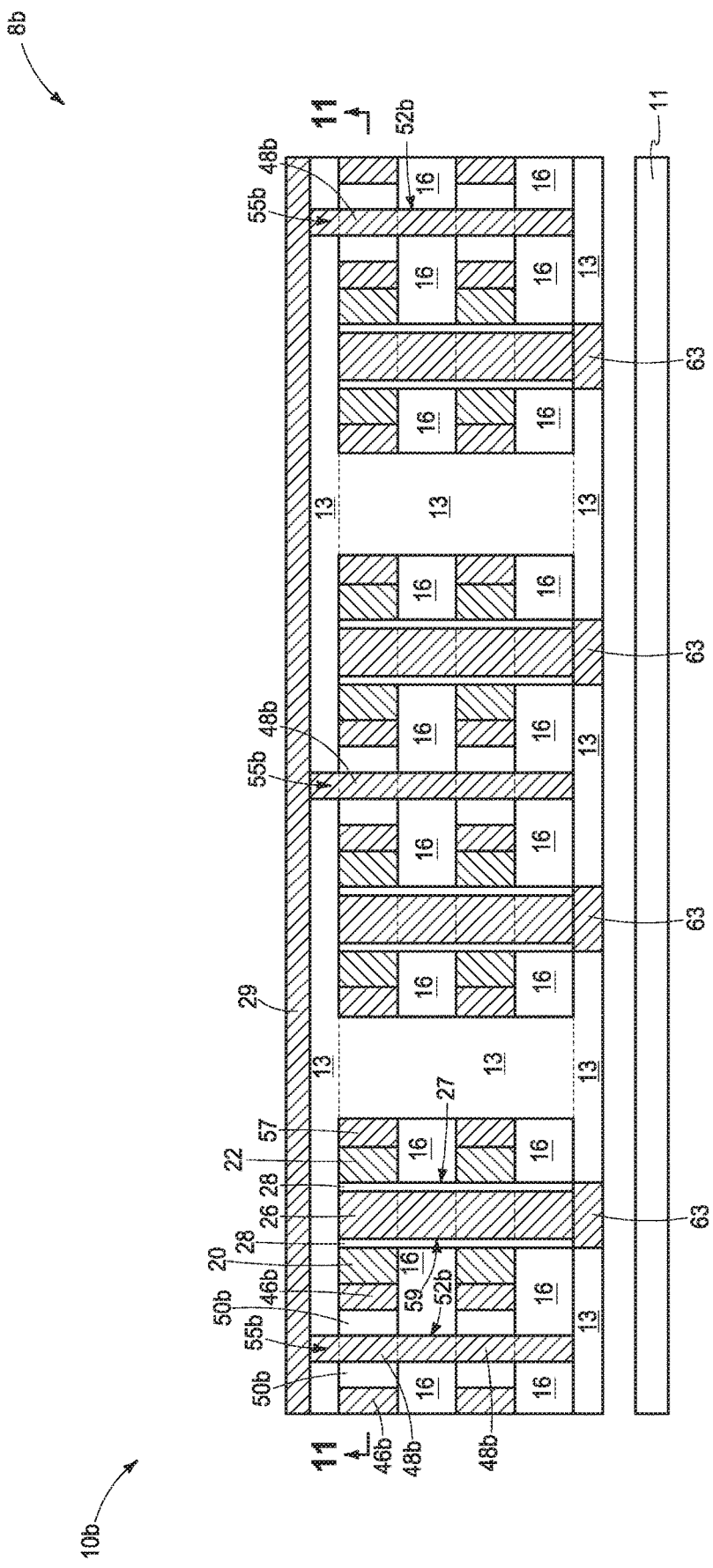
FIG. 12 is a sectional view taken through line 12-12 in FIG. 11.

FIGS. 10-12 show an alternate embodiment construction 8*b* comprising a memory array 10*b*. Like numerals from the above-described embodiments have been used where appropriate, with some construction differences being indicated with the suffix "b". Example construction 8*b* differs from the example embodiments shown in FIGS. 1-3 in having a capacitor-electrode structure 52*b* that comprises a horizontally-elongated wall or plate 55*b* as opposed to a pillar. Any other attribute(s) or aspect(s) as shown and/or described herein with respect to other embodiments may be used in the embodiments of FIGS. 10-12.

The above example structures may be manufactured by any existing or yet-to-be-developed techniques. Further, embodiments of the invention encompass methods of forming a memory array comprising memory cells individually comprising a transistor and a capacitor. Such methods may have or use any of the structural attributes described above and shown as the largely finished circuitry constructions of FIGS. 1-12, or may not. Additionally, aspects of the invention include a memory array comprising vertically-alternating tiers of insulative material and memory cells as herein disclosed and described independent of method of manufacture. Regardless, one example technique of manufacturing the embodiments shown by FIGS. 1-3 and a method embodiment of the invention are described with reference to FIGS. 13-34. Like numerals from the above-described embodiments have been used for predecessor construction(s), regions, and like/predecessor materials thereof.

Figure 13:
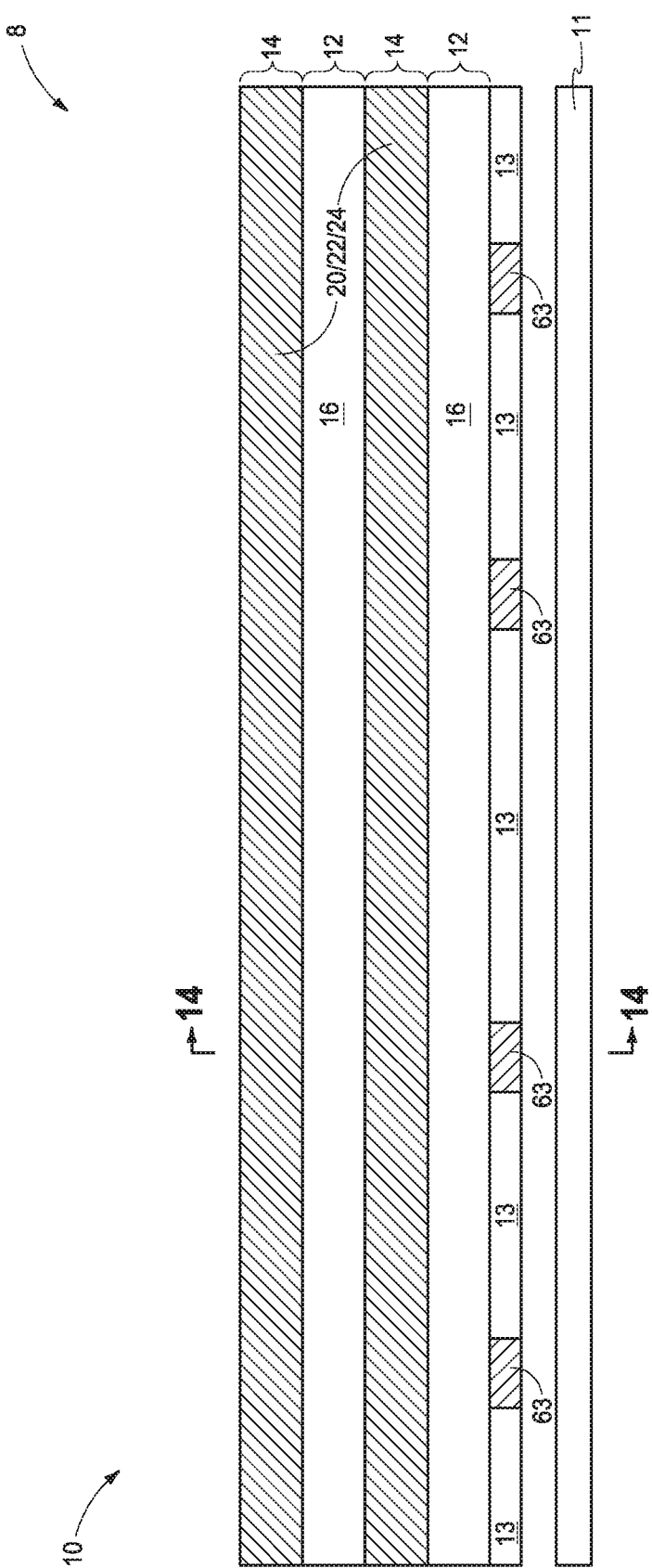
FIG. 13 is a diagrammatic sectional view of a predecessor substrate to that shown by FIGS. 1-3, and is taken through line 13-13 in FIG. 14.
Figure 14:
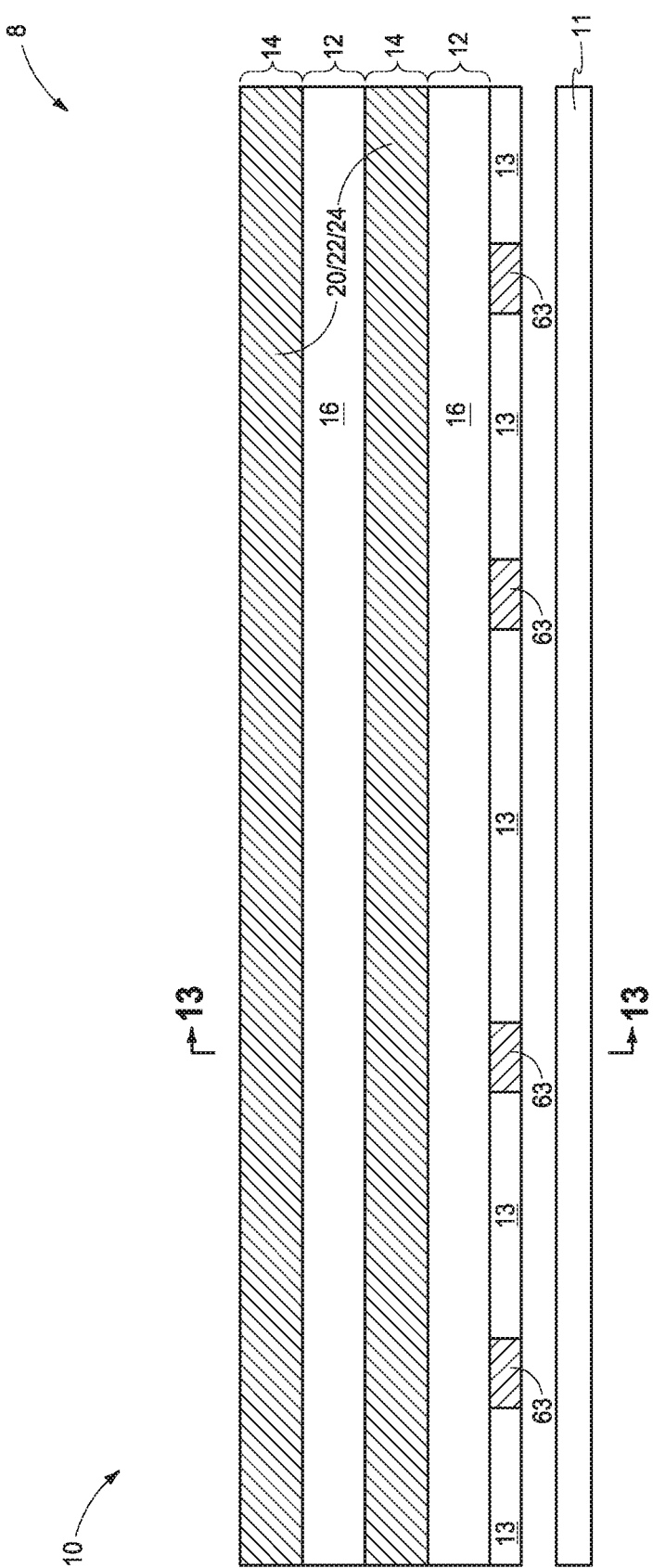
FIG. 14 is a sectional view taken through line 14-14 in FIG. 13.

Referring to FIGS. 13 and 14, vertically-alternating tiers 12 and 14 of insulative material 16 and transistor material 20/22/24 have been formed above substrate 11 and above previously-formed insulating material 13 and lines 63. Transistor-material tiers 14 individually comprise respective first source/drain regions 20, second source/drain regions 22, and channel regions 24 horizontally there-between of individual transistors 25 (not numerically designated in FIGS. 13 and 14). Such regions at this point of the process may or may not be at desired finished doping concentration(s) if doped semiconductive material.

Figure 15:
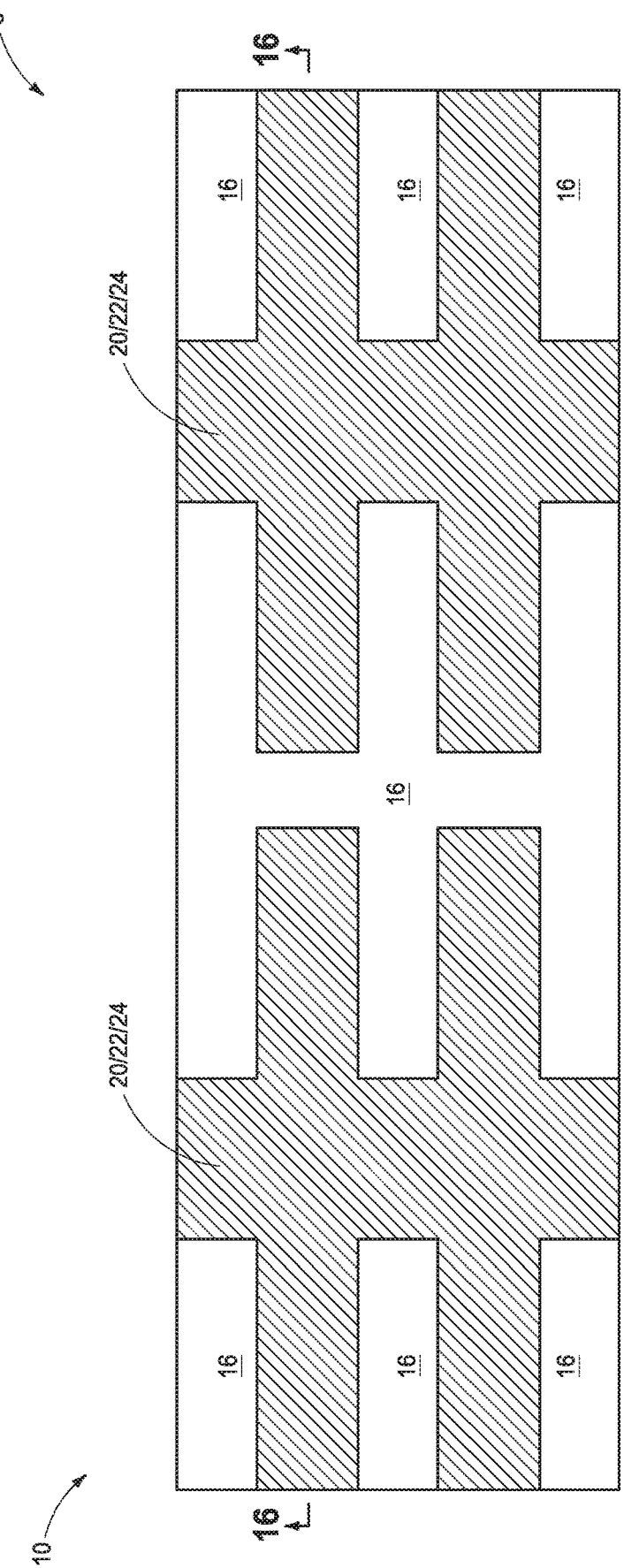
FIG. 15 is a horizontal sectional view of the FIGS. 13 and 14 substrate at a processing step subsequent to that shown by FIGS. 13 and 14.
Figure 16:
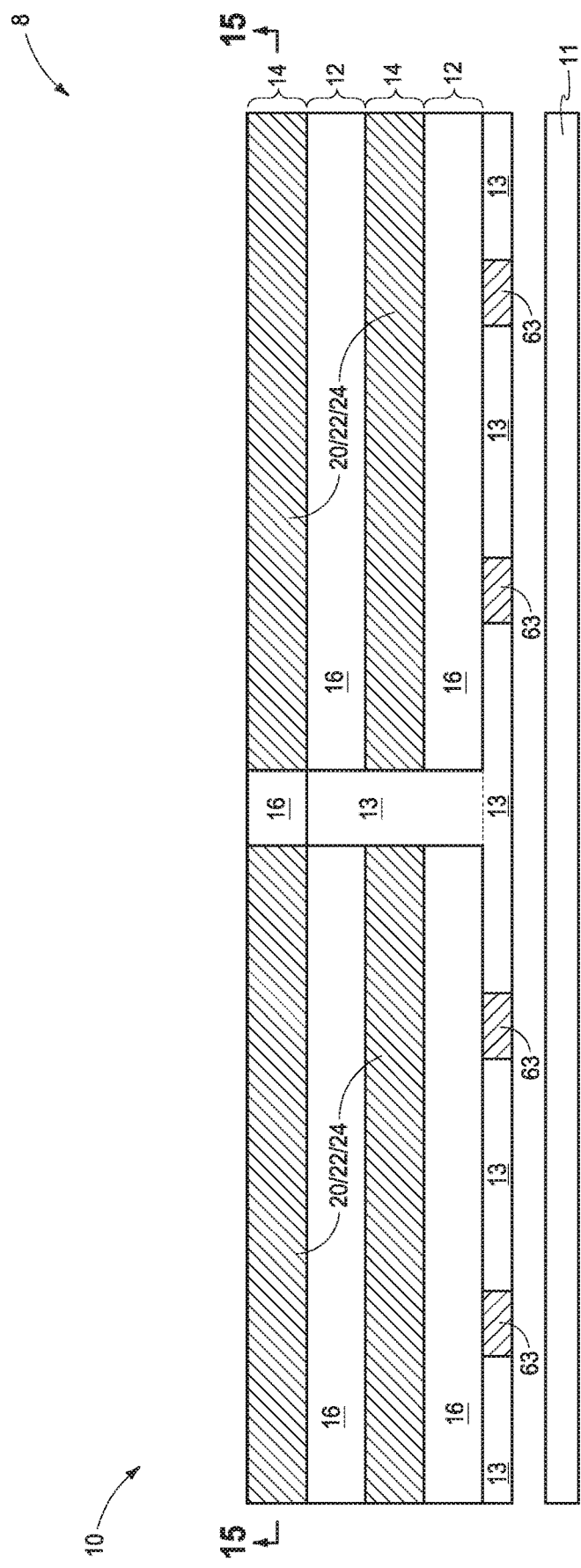
FIG. 16 is a sectional view taken through line 16-16 in FIG. 15.

Referring to FIGS. 15 and 16, transistor material 20/22/24 of transistor-material tiers 14 and insulative material 16 of insulative-material tiers 12 have been patterned through the stack of FIGS. 13 and 14. Then, in one embodiment, a void space left thereby is filled with insulating material 13 which extends elevationally through multiple tiers 12 and 14, followed by planarizing back insulating material 13 to have its top surface be coplanar (not shown) with the top surface of elevationally outermost transistor-material tier 14. Insulating material 13 is then etched selectively relative to transistor material 20/22/24 (e.g., using HF when material 13 is silicon dioxide and material 20/22/24 is predominately elemental silicon). This is followed by deposition of insulative material 16 to fill the void spaces formed by etching insulating material 13, then followed by planarizing back insulative material 16 to form the depicted construction.

Figure 17:
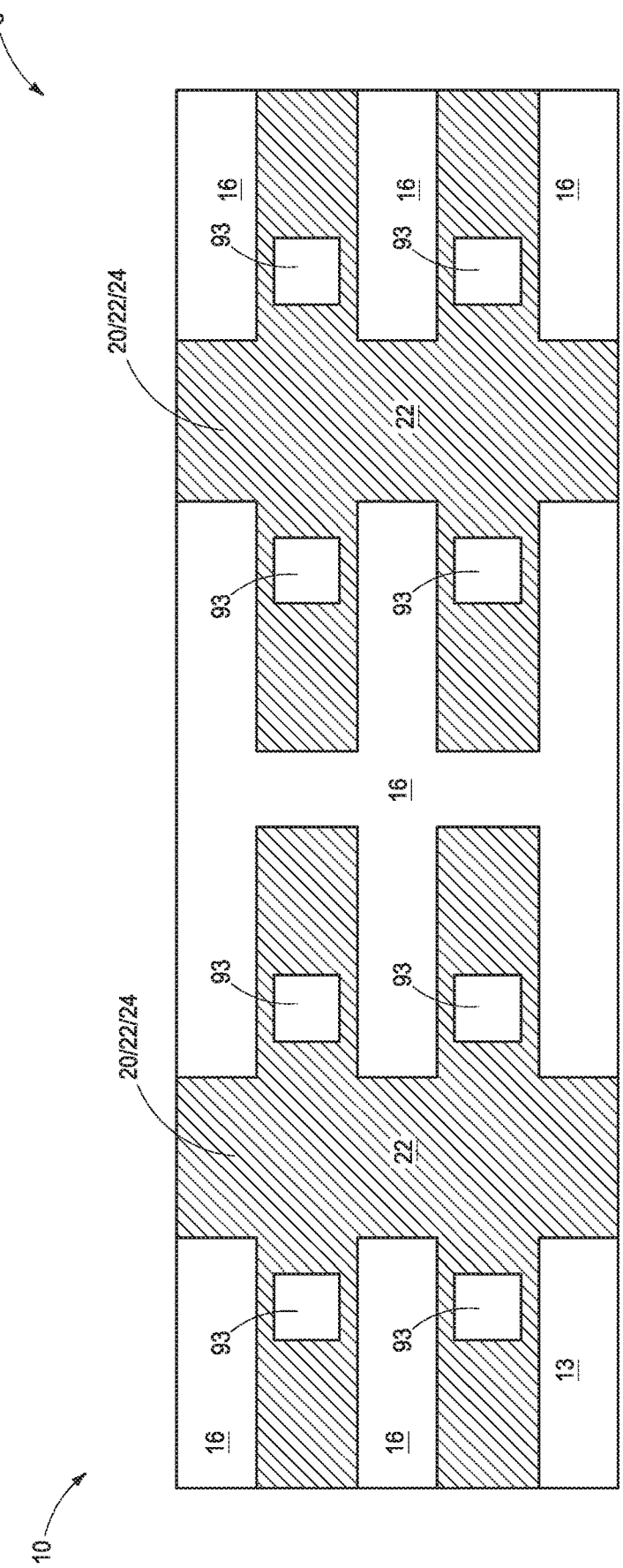
FIG. 17 is a sectional view of the FIG. 15 substrate at a processing step subsequent to that shown by FIG. 15.

Referring to FIG. 17, gate openings 93 have been formed to extend elevationally through transistor material 20/22/24 and insulative material 16 of multiple tiers 12 and 14. As an example, such may be formed using a suitable masking step, and with or without pitch multiplication. While multiple openings 93 are shown, the discussion largely proceeds relative to fabrication associated with respect to a single opening 93, and a single transistor and access line (neither being numerically designated in FIG. 17). Further, transistor material 20/22/24 that is about gate openings 93 may be suitably doped after forming gate openings 93. For example, gas phase doping(s) could be applied to the construction of FIG. 17 to form one or more of regions/materials 20, 22, and 24 to their respective desired final doping concentration(s). Alternately, and by way of example only, one or more dopant-source sacrificial plugs could fill gate openings 93 and dopant diffused from such plug(s) into surrounding transistor material 20, 22, and/or 24 to achieve desired final doping concentration(s).

Figure 18:
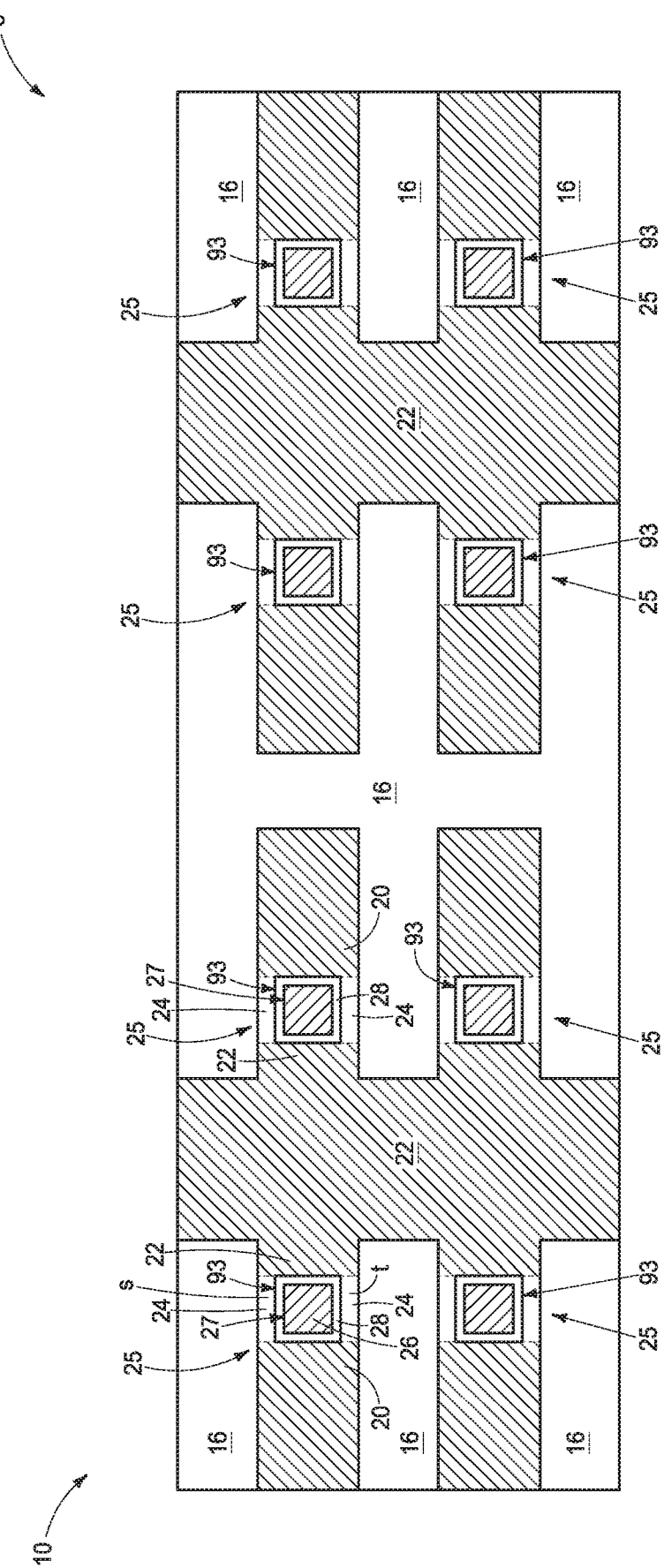
FIG. 18 is a sectional view of the FIG. 17 substrate at a processing step subsequent to that shown by FIG. 17.

Referring to FIG. 18, within gate opening 93, gate-insulator 28 (e.g., as an annulus) and conductive gate material 26 have been formed radially inward of gate-insulator annulus 28. Conductive gate material 26 extends elevationally through multiple tiers 12 and 14, for example as shown in FIG. 3, and comprises a gate 26 of the individual transistors being formed in different transistor-material tiers 14. Further, such conductive gate material comprises an access line pillar 27 that interconnects gates 26 of those individual transistors in different transistor-material tiers 14 along that access line. Channel region 24 in individual transistor-material tiers 14 is laterally proximate gate-insulator 28 and gate 26 in that individual transistor-material tier 14. Accordingly, and in one embodiment, gate 26 of individual transistors in different memory-cell tiers 14 comprises a portion of elevationally-extending access-line pillar 27.

Figure 19:
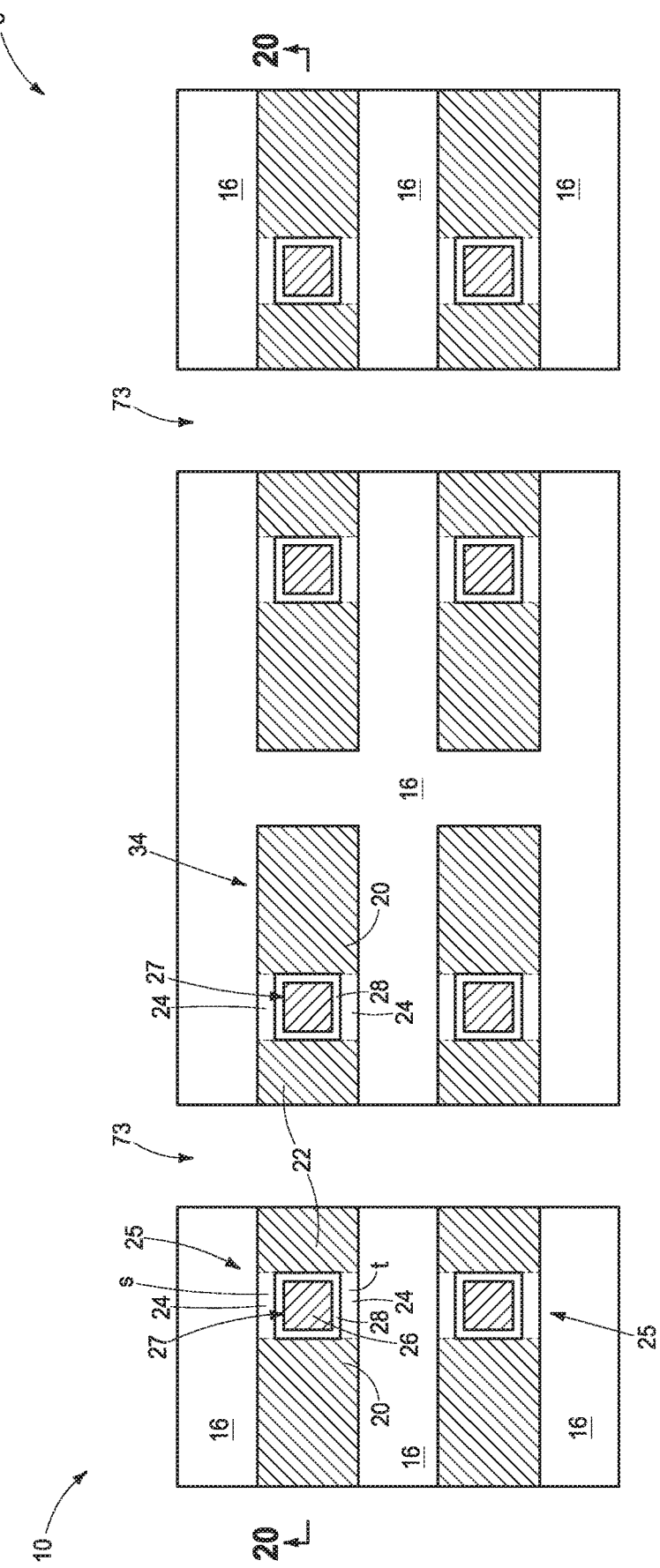
FIG. 19 is a sectional view of the FIG. 18 substrate at a processing step subsequent to that shown by FIG. 18, and is taken through line 19-19 in FIG. 20.
Figure 20:
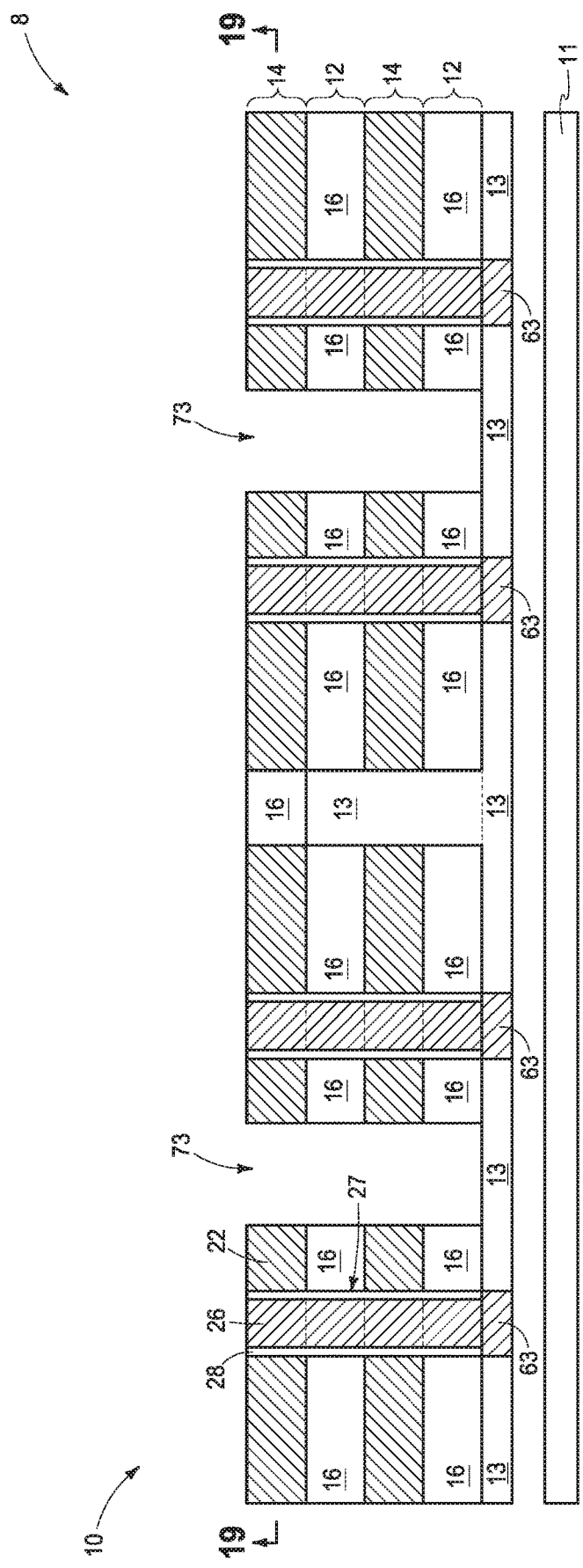
FIG. 20 is a sectional view taken through line 20-20 in FIG. 19.

Referring to FIGS. 19 and 20, a horizontally-elongated trench 73 has been formed elevationally through transistor material 22 and insulative material 16 of multiple tiers 12 and 14, and elevationally into insulating material 13.

Figure 21:
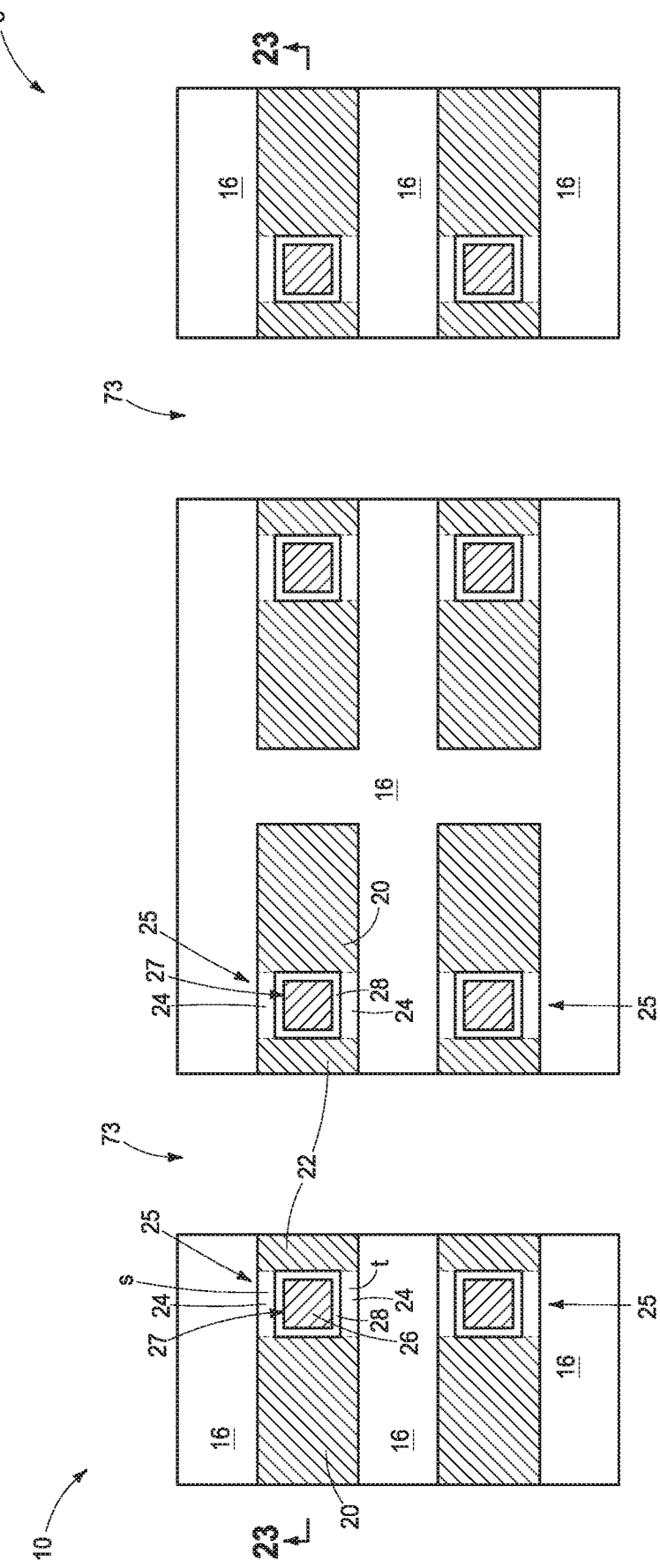
FIG. 21 is a sectional view of the FIG. 19 substrate at a processing step subsequent to that shown by FIG. 19, and is taken through line 21-21 in FIG. 23.
Figure 22:
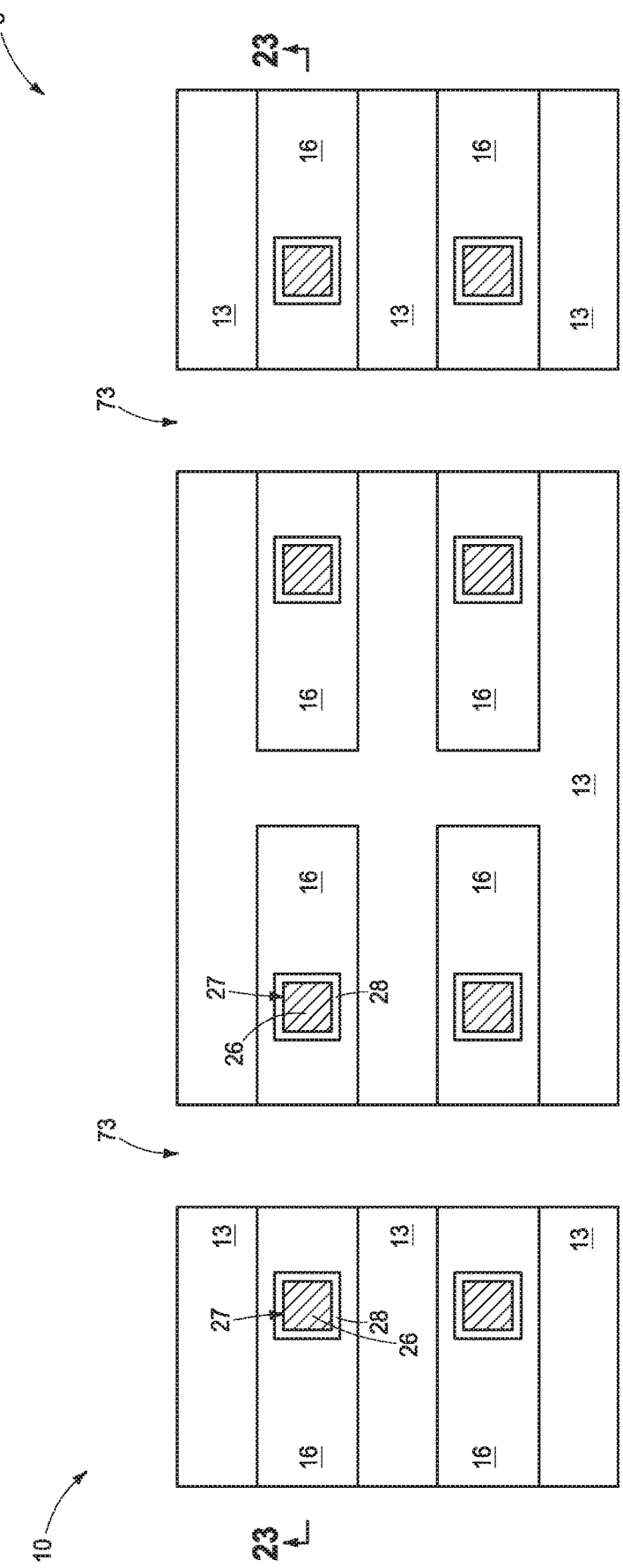
FIG. 22 is a sectional view taken through line 22-22 in FIG. 23.
Figure 23:
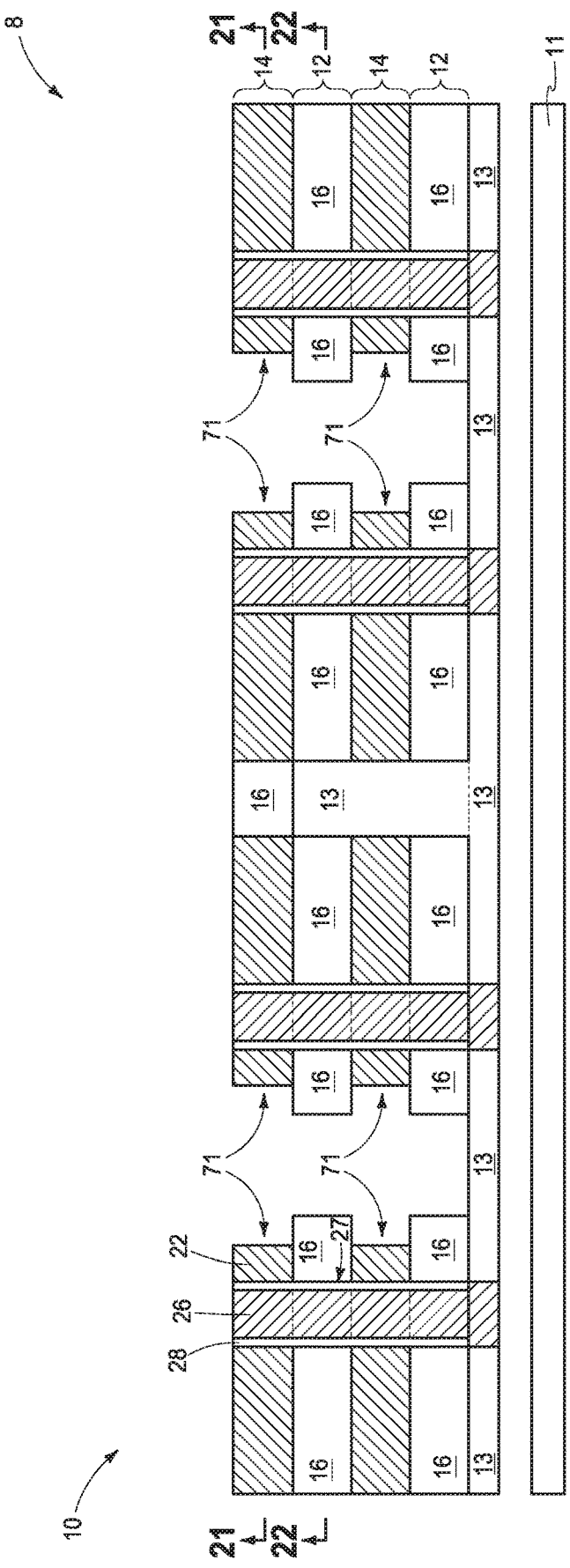
FIG. 23 is a sectional view taken through line 23-23 in FIGS. 21 and 22.

Referring to FIGS. 21-23, within individual trenches 73, transistor material 22 and insulating material 13 have been laterally recessed selectively relative to insulating material 16 to form a horizontally-elongated sense-line trench 71 in individual transistor-material tiers 14. An example etching chemistry that may be used where insulating material 13 is silicon dioxide is dilute HF and where material of region 20 predominately comprises elemental-form silicon is tetramethyl-ammonium hydroxide (TMAH).

Figure 24:
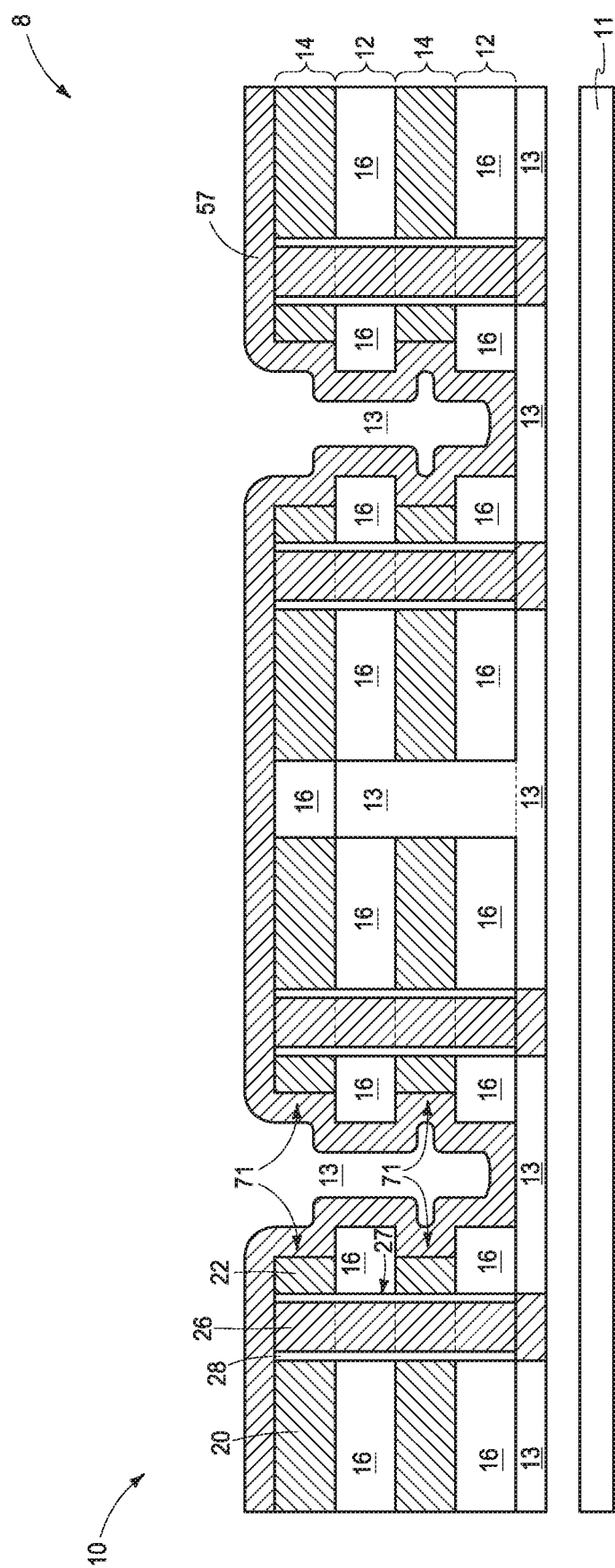
FIG. 24 is a sectional view of the FIG. 23 substrate at a processing step subsequent to that shown by FIG. 23.

Referring to FIG. 24, conductive sense line material 57 has been deposited in individual sense-line trenches 71 in individual transistor-material tiers 14.

Figure 25:
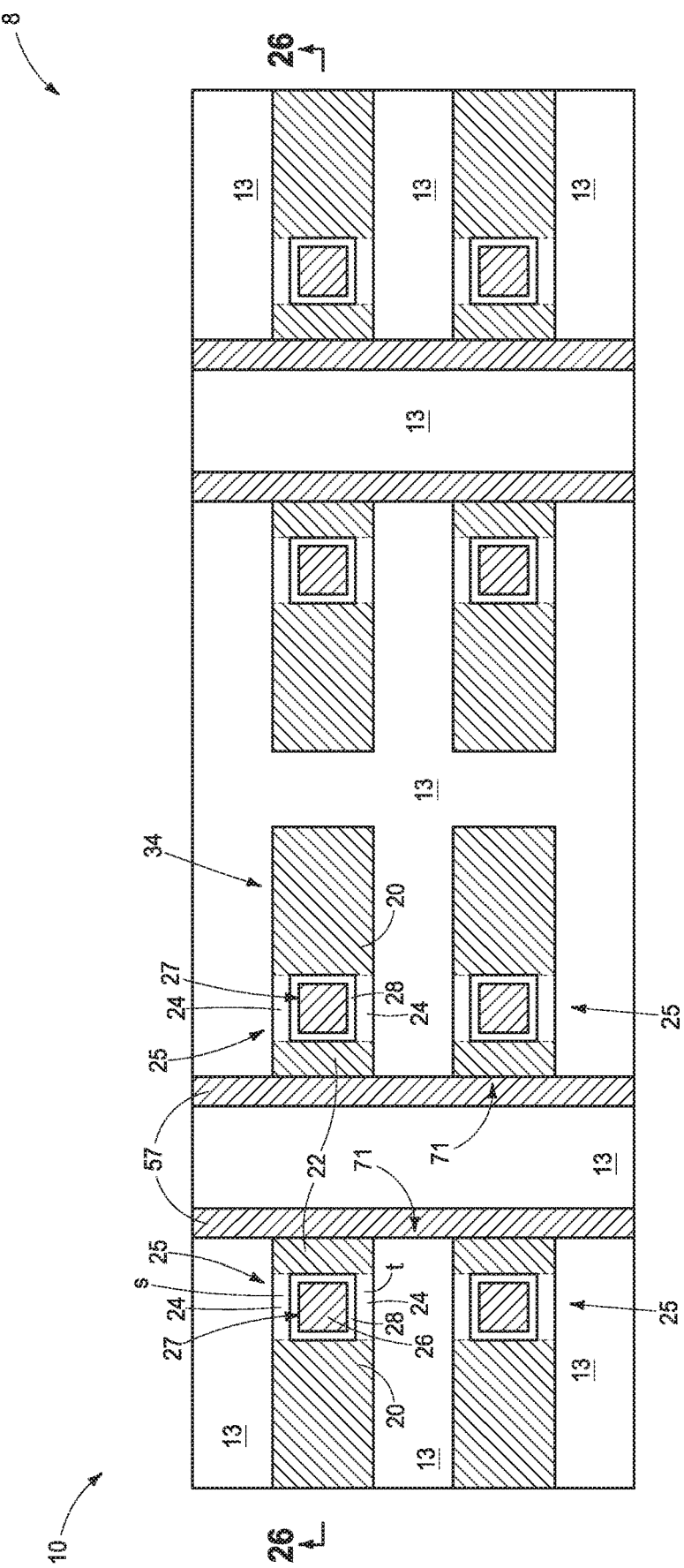
FIG. 25 is a sectional view of the FIG. 21 substrate at a processing step subsequent to that shown by FIG. 24, and is taken through line 25-25 in FIG. 26.
Figure 26:
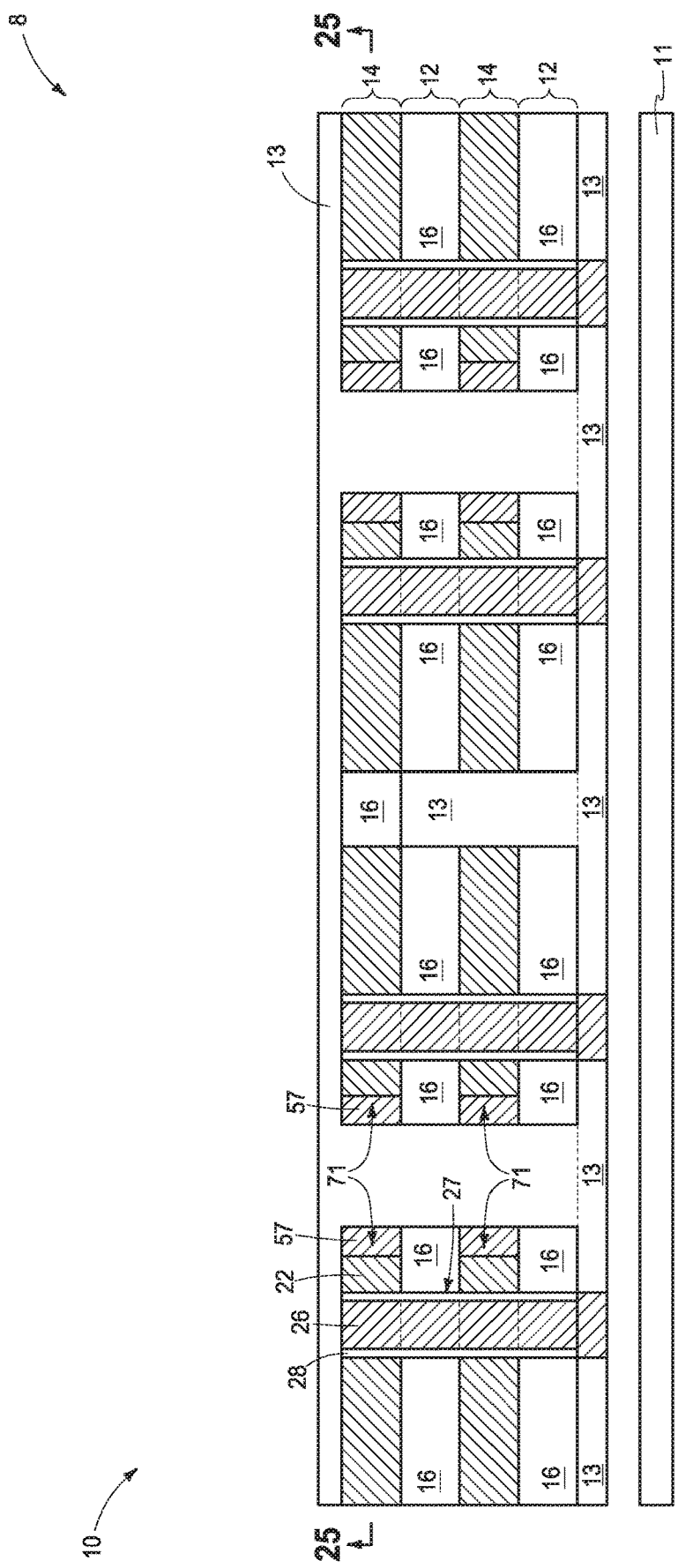
FIG. 26 is a sectional view taken through line 26-26 in FIG. 25.

Referring to FIGS. 25 and 26, such conductive material has been etched back to form a horizontally-elongated sense line 57 in individual sense-line trenches 71, which thereby forms sense lines 57 in a self-aligned manner. Example insulative material 13 has then been deposited to fill remaining volume of trenches 73 and planarized back as shown. Individual horizontally-elongated sense lines 57 electrically couple together multiple second source/drain regions 22 of multiple individual transistors 25 that are in that transistor-material tier 14.

Figure 27:
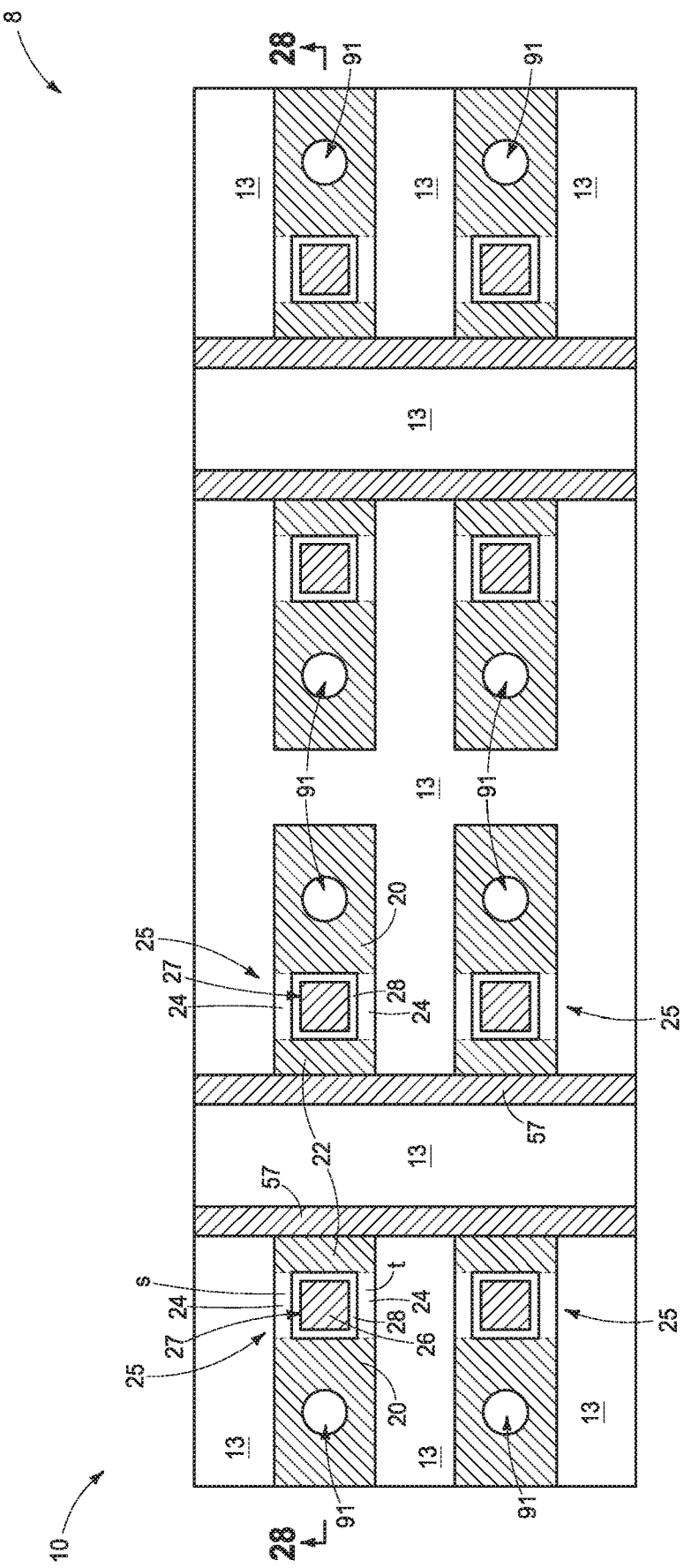
FIG. 27 is a sectional view of the FIG. 25 substrate at a processing step subsequent to that shown by FIG. 25, and is taken through line 27-27 in FIG. 28.
Figure 28:
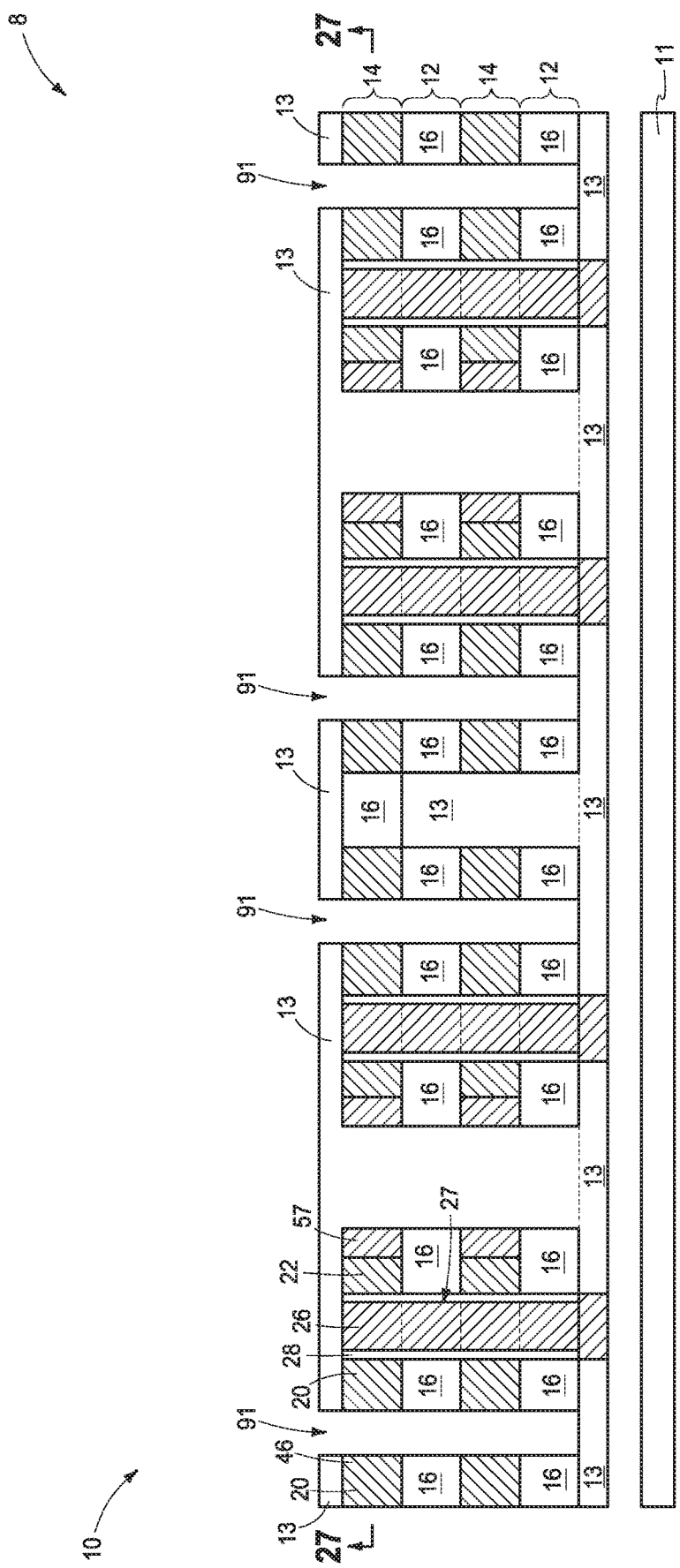
FIG. 28 is a sectional view taken through line 28-28 in FIG. 27.

Referring to FIGS. 27 and 28, capacitor openings 91 have been formed to extend elevationally through transistor material 20 and insulative material 16 of multiple tiers 12 and 14. As an example, such may be formed using a suitable masking step, and with or without pitch multiplication. While multiple openings 91 are shown, the discussion largely proceeds relative to fabrication associated with respect to a single opening 91, and a single capacitor 34 and a single capacitor-electrode structure 52 (neither being formed yet nor numerically designated in FIGS. 27 and 28).

Figure 29:
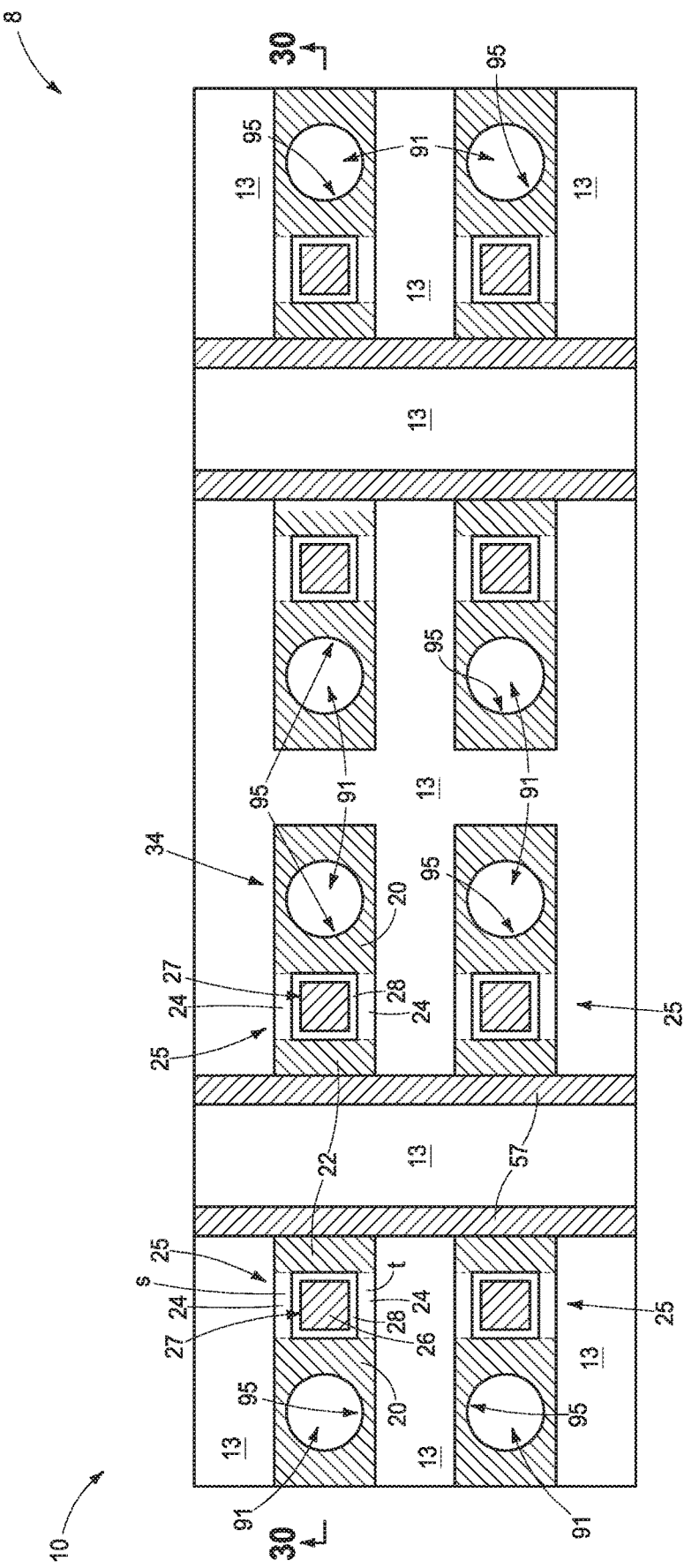
FIG. 29 is a sectional view of the FIG. 27 substrate at a processing step subsequent to that shown by FIG. 27, and is taken through line 29-29 in FIG. 30.
Figure 30:
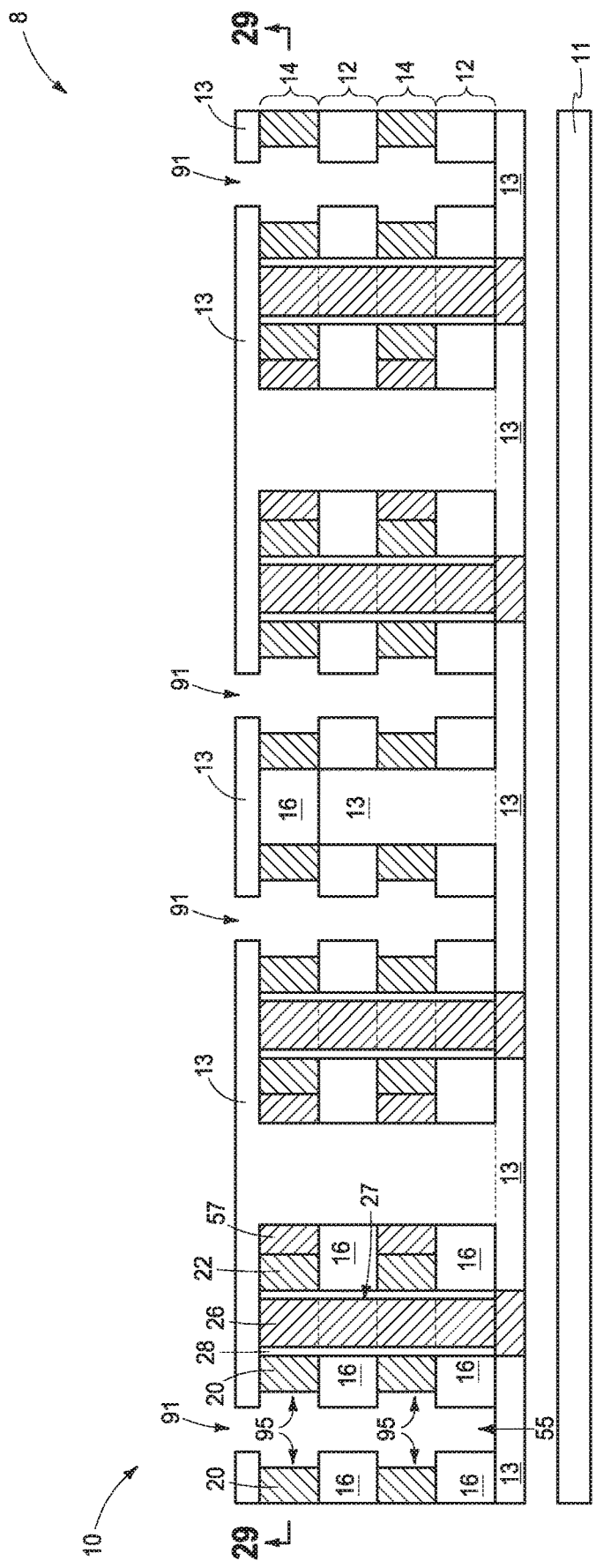
FIG. 30 is a sectional view taken through line 30-30 in FIG. 29.

Referring to FIGS. 29 and 30 and within individual capacitor openings 91, transistor material 20 has been laterally (e.g., radially) recessed (e.g., using TMAH) to form a first-capacitor-electrode cavity 95 in individual transistor-material tiers 14.

Figure 31:
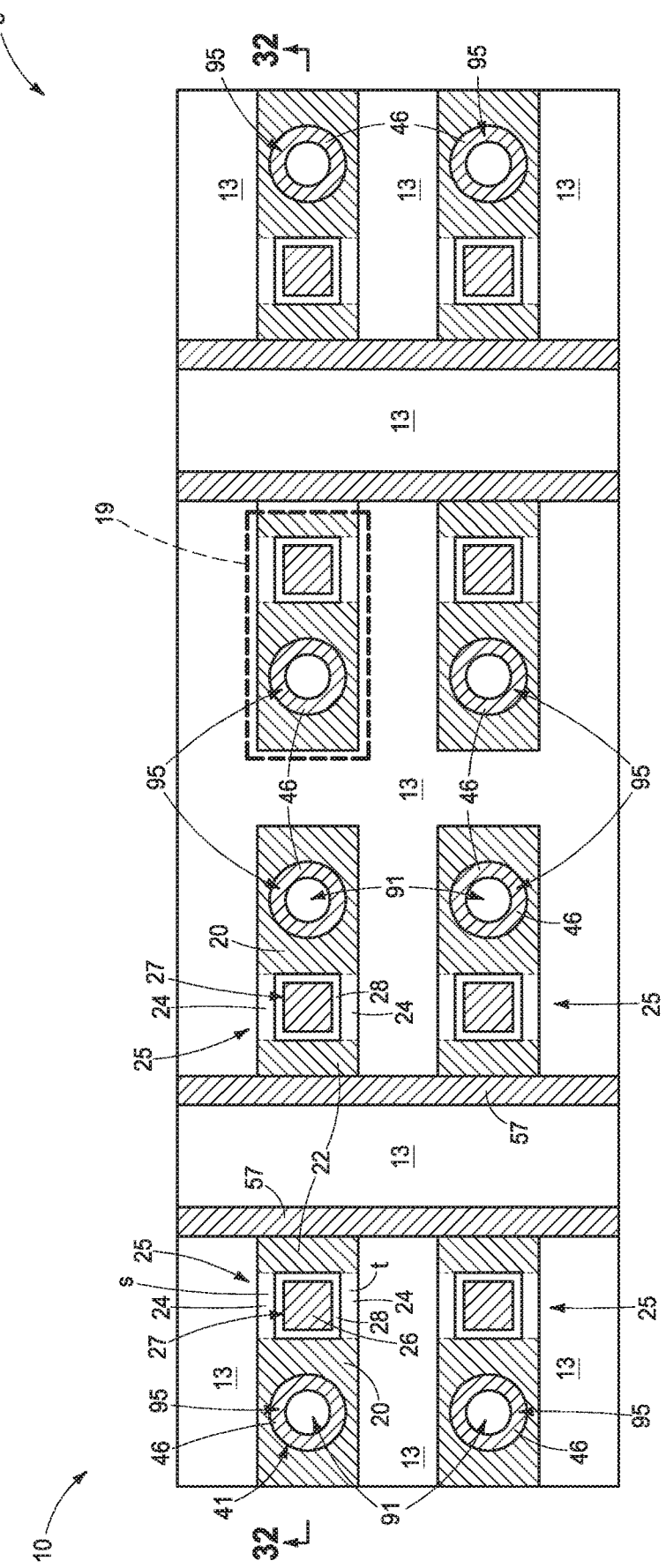
FIG. 31 is a sectional view of the FIG. 29 substrate at a processing step subsequent to that shown by FIG. 29, and is taken through line 31-31 in FIG. 32.
Figure 32:
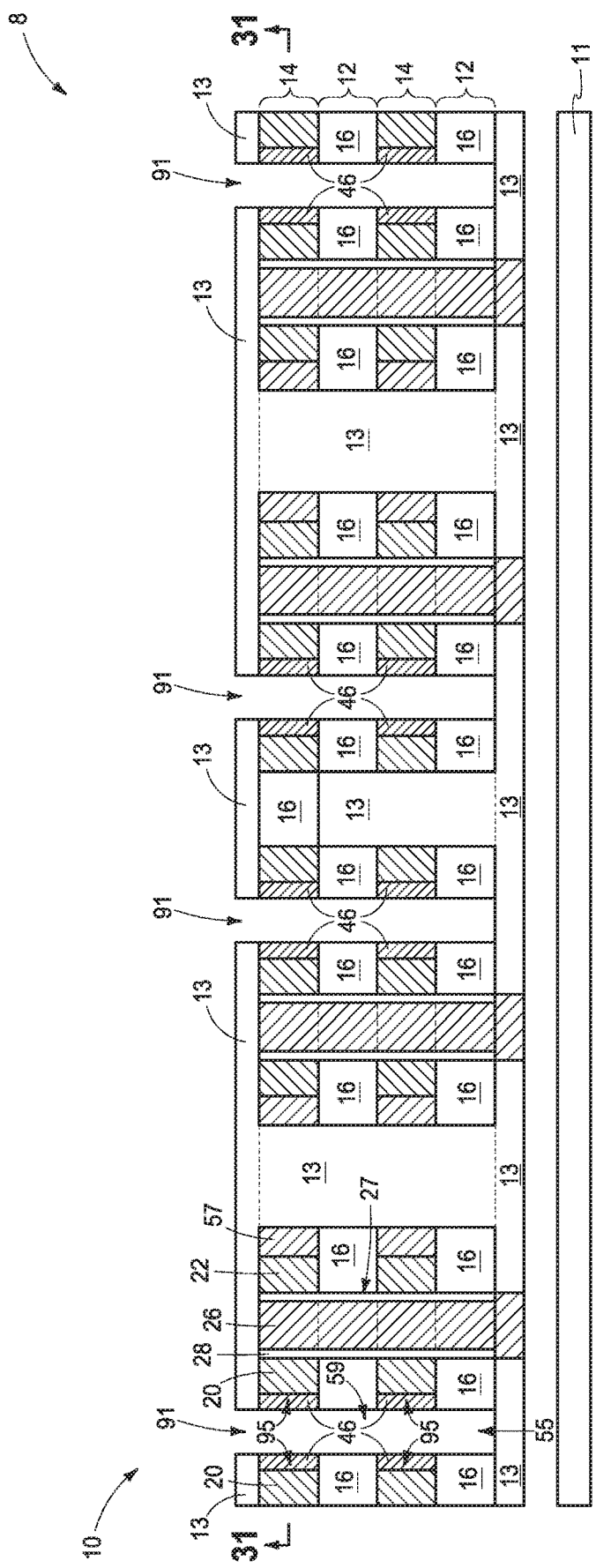
FIG. 32 is a sectional view taken through line 32-32 in FIG. 31.

Referring to FIGS. 31 and 32, a first capacitor electrode 46 has been formed in individual first-capacitor-electrode cavities 95 in individual transistor-material tiers 14.

Figure 33:
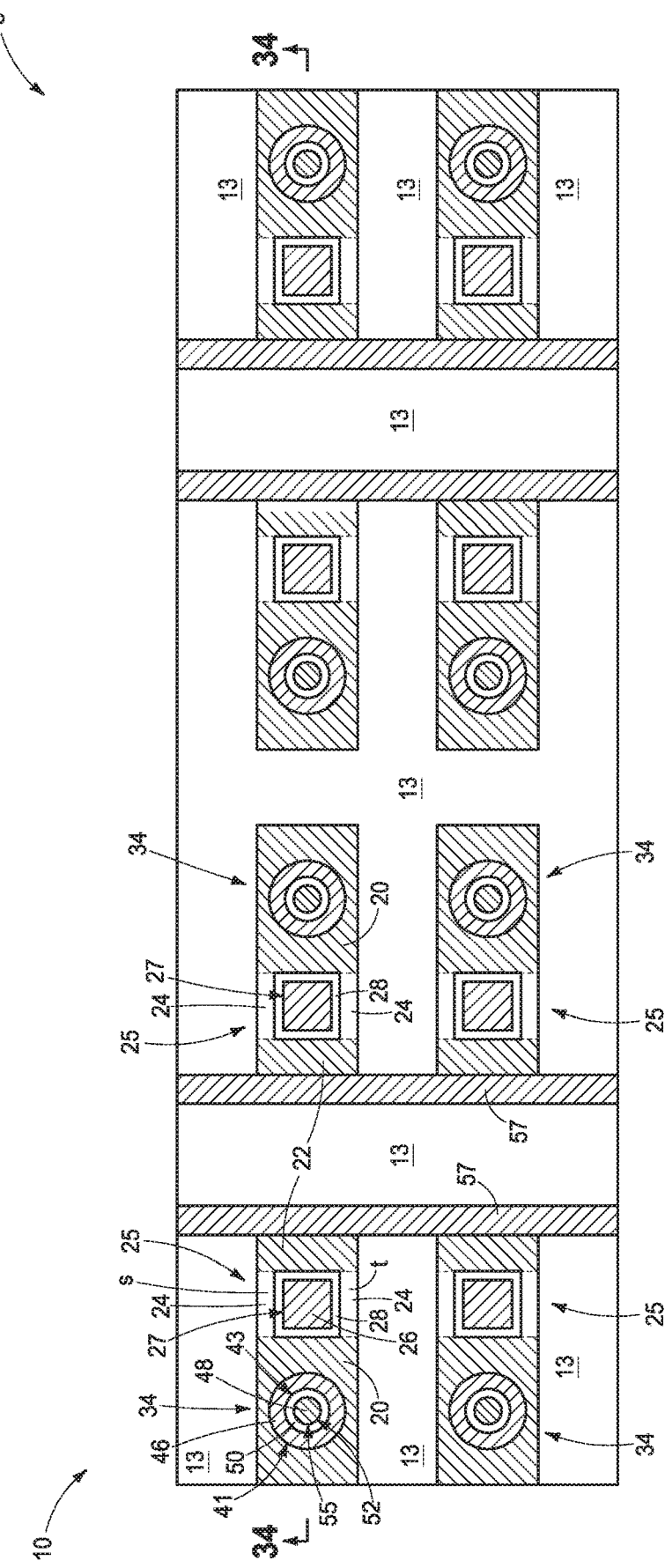
FIG. 33 is a sectional view of the FIG. 31 substrate at a processing step subsequent to that shown by FIG. 31, and is taken through line 33-33 in FIG. 34.
Figure 34:
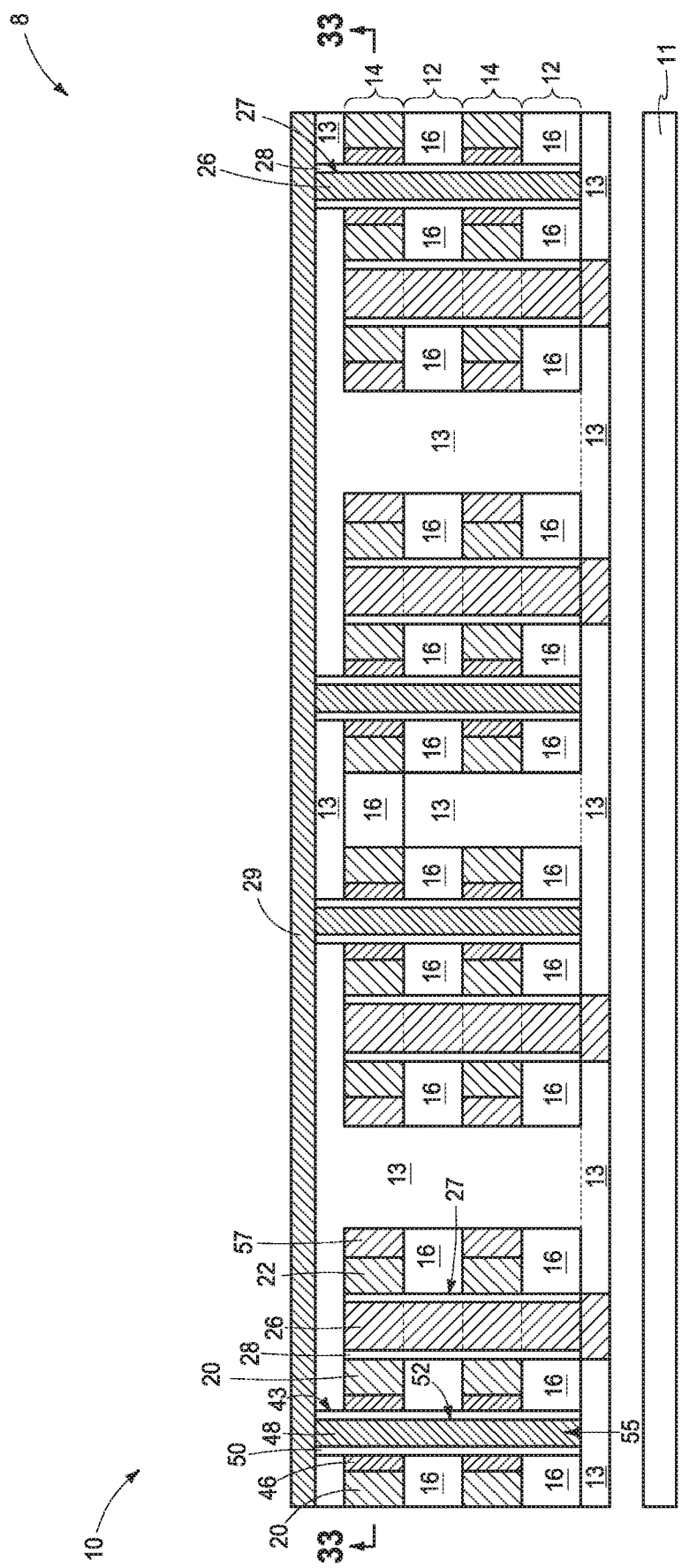
FIG. 34 is a sectional view taken through line 34-34 in FIG. 33.

Referring to FIGS. 33 and 34, capacitor insulator 50 has been formed in capacitor opening 91, following by deposition of conductive material to form second capacitor electrodes 48 and capacitor-electrode structure 52 radially inward of capacitor insulator 50. Such extends elevationally through multiple vertically-alternating tiers 12 and 14, and with elevationally-extending capacitor-electrode structure 52 comprising second electrodes 48 of individual capacitors 34. Second electrodes 48 of multiple capacitors 34 in array 10 may be electrically coupled with one another, for example by fabrication of component(s) 29 in FIG. 3.

The above example method formed capacitors 34 after forming sense lines 57. Alternately, capacitors 34 may be formed before (not shown) forming sense lines 57. Regardless, any other attribute(s) or aspect(s) as shown and/or described herein with respect to other embodiments may be used.

Analogous processing may be used to fabricate any other of the structures as shown herein, for example the embodiments described above with reference to FIGS. 4-12.

An additional embodiment of the invention encompasses a method of forming a memory array, for example and by way of example only that described above with respect to FIGS. 4-9. Such a method includes forming vertically-alternating tiers (e.g., 12, 14) of insulative material (e.g., 16) and transistor material (e.g., 20/22/24). The transistor-material tiers individually comprise a first source/drain (e.g., 20) region and a second source/drain region (e.g., 22) having a channel region (e.g., 24) horizontally there-between. A pair of access-line pillars (e.g., 27a) extend elevationally through the vertically-alternating tiers on opposite sides of individual of the channel regions that are in different of the transistor-material tiers. Portions of the access-line pillars in the different transistor-material tiers comprise a pair of gates (e.g., 26a) on the opposite sides of the individual channel regions of individual of transistors (e.g., 25a) in the different transistor-material tiers. A sense line (e.g., 57) is formed that is electrically coupled to multiple of the second source/drain regions. Capacitors (e.g., 34a) are formed that individually comprise first and second electrodes (e.g., 46 and 48, respectively) having a capacitor insulator (e.g., 50) therebetween. The first electrode is electrically coupled to individual of the first source/drain regions. The second capacitor electrodes of multiple of the capacitors in the array are electrically coupled with one another.

In one such embodiment, conductor material (e.g., 33) is formed to directly electrically couple the pair of access-line pillars together. In one latter such embodiment, a horizontal longitudinally-elongated conductive line (e.g., 77) is formed above and is directly electrically coupled to the conductor material of multiple of the pairs of access-line pillars.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, a selective etch or removal is an etch or removal where one material is removed relative to another stated material or materials at a rate of at least 2.0:1. Further, selectively growing or selectively forming is growing or forming one material relative to another stated material or materials at a rate of at least 2.0:1 for at least the first 100 Angstroms of growing or forming.

Further, a "self-aligned manner" means a technique whereby at least a lateral surface of a structure is defined by deposition of material against a sidewall of a previously-patterned structure.

CONCLUSION

In some embodiments, a memory array comprises vertically-alternating tiers of insulative material and memory cells, with the memory cells individually comprising a transistor comprising first and second source/drain regions having a channel region there-between and a gate operatively proximate the channel region. At least a portion of the channel region is horizontally-oriented for horizontal current flow in the portion between the first and second source/drain regions. A capacitor of the memory cell comprises first and second electrodes having a capacitor insulator there-between. The first electrode is electrically coupled to the first source/drain region. The second capacitor electrodes of multiple of the capacitors in the array are electrically coupled with one another. A sense line is electrically coupled to multiple of the second source/drain regions. An access-line pillar extends elevationally through the vertically-alternating tiers. The gate of individual of the transistors in different of the memory-cell tiers comprises a portion of the elevationally-extending access-line pillar.

In some embodiments, A memory array comprises vertically-alternating tiers of insulative material and memory cells, with the memory cells individually comprising a transistor comprising first and second source/drain regions having a channel region there-between and a gate operatively proximate the channel region. At least a portion of the channel region is horizontally-oriented for horizontal current flow in the portion between the first and second source/drain regions. A capacitor of the memory cell comprises first and second electrodes having a capacitor insulator there-between. The first electrode is electrically coupled to the first source/drain region. The second capacitor electrodes of multiple of the capacitors in the array are electrically coupled with one another. A horizontal longitudinally-elongated sense line is in individual of the memory-cell tiers. Individual of the second source/drain regions of individual of the transistors that are in the same memory-cell tier are electrically coupled to the horizontal longitudinally-elongated sense line in that individual tier of memory cells.

In some embodiments, a memory array comprises vertically-alternating tiers of insulative material and memory cells, with the memory cells individually comprising a transistor comprising first and second source/drain regions having a channel region there-between and a gate operatively proximate the channel region. At least a portion of the channel region is horizontally-oriented for horizontal current flow in the portion between the first and second source/drain regions. A capacitor of the memory cell comprises first and second electrodes having a capacitor insulator there-between. The first electrode is electrically coupled to the first source/drain region. A horizontal longitudinally-elongated sense line is in individual of the memory-cell tiers. Individual of the second source/drain regions of individual of the transistors that are in the same memory-cell tier are electrically coupled to the horizontal longitudinally-elongated sense line in that individual tier of memory cells. A capacitor-electrode structure extends elevationally through the vertically-alternating tiers. Individual of the second electrodes of individual of the capacitors are electrically coupled to the elevationally-extending capacitor-electrode structure. An access-line pillar extends elevationally through the vertically-alternating tiers. The gate of individual of the transistors in different of the memory-cell tiers comprises a portion of the elevationally-extending access-line pillar.

In some embodiments, a memory array comprises vertically-alternating tiers of insulative material and memory cells, with the memory cells individually comprising a transistor comprising first and second source/drain regions having a channel region there-between. At least a portion of the channel region is horizontally-oriented for horizontal current flow in the portion between the first and second source/drain regions. A capacitor of the memory cell comprises first and second electrodes having a capacitor insulator there-between. The first electrode is electrically coupled to the first source/drain region. The second capacitor electrodes of multiple of the capacitors in the array are electrically coupled with one another. A pair of laterally-spaced access-line pillars extends elevationally through the vertically-alternating tiers on opposite sides of individual of the channel regions that are in different of the memory-cell tiers. Portions of the access-line pillars in the different memory-cell tiers comprise a pair of gates on the opposite sides of the individual channel regions of individual of the transistors in the different memory-cell tiers. A sense line is electrically coupled to multiple of the second source/drain regions.

In some embodiments, a method of forming a memory array, the memory array comprising memory cells individually comprising a transistor and a capacitor, comprises forming vertically-alternating tiers of insulative material and transistor material. The transistor-material tiers individually comprise a first source/drain region and a second source/drain region having a channel region horizontally there-between and a gate operatively proximate the channel region. An access-line pillar extends elevationally through the vertically-alternating tiers. The gate of individual of the transistors in different of the transistor-material tiers comprises a portion of the elevationally-extending access-line pillar. Insulating material extends elevationally through multiple of the vertically-alternating tiers. A horizontally-elongated trench is formed elevationally through the transistor material and the insulative material of the multiple vertically-alternating tiers and elevationally into the insulating material. Within the trench, the transistor material and the insulating material are laterally recessed relative to the insulative material to form a horizontally-elongated sense-line trench in the individual transistor-material tiers. A horizontally-elongated sense line is formed in individual of the sense-line trenches in the individual transistor-material tiers. Individual of the horizontally-elongated sense lines electrically couple together multiple of the second source/drain regions of multiple individual transistors that are in that transistor-material tier. Capacitors are formed that individually comprise first and second electrodes having a capacitor insulator there-between. The first electrode is electrically coupled to individual of the first source/drain regions of individual of the multiple individual transistors that are in that transistor-material tier. The second capacitor electrodes of multiple of the capacitors in the array are electrically coupled with one another.

In some embodiments, a method of forming a memory array, the memory array comprising memory cells individually comprising a transistor and a capacitor, comprises forming vertically-alternating tiers of insulative material and transistor material. The transistor-material tiers individually comprise a first source/drain region, a second source/drain region, and a channel region horizontally there-between. Insulating material is formed to extend elevationally through multiple of the tiers. A gate opening is formed to extend elevationally through the transistor material and the insulative material of the multiple vertically-alternating tiers. Within the gate opening, a gate-insulator annulus is formed and conductive gate material is formed radially inward of the gate-insulator annulus. The conductive gate material extends elevationally through the multiple vertically-alternating tiers, comprises a gate of individual of the transistors in different of the transistor-material tiers, and comprises an access line that interconnects the gates of those individual transistors in the different transistor-material tiers along that access line. The channel region in the individual transistor-material tiers is laterally proximate the gate-insulator annulus and the gate in that individual transistor-material tier. A horizontally-elongated trench is formed elevationally through the transistor material and the insulative material of the multiple tiers and elevationally into the insulating material. Within the trench, the transistor material and the insulating material are laterally recessed relative to the insulative material to form a horizontally-elongated sense-line trench in the individual transistor-material tiers. A horizontally-elongated sense line is formed in individual of the sense-line trenches in the individual transistor-material tiers. Individual of the horizontally-elongated sense lines electrically couple together multiple of the second source/drain regions of multiple individual transistors that are in that transistor-material tier. Capacitors are formed that individually comprise first and second electrodes having a capacitor insulator there-between. The first electrode is electrically coupled to individual of the first source/drain regions of individual of the multiple individual transistors that are in that transistor-material tier. The second capacitor electrodes of multiple of the capacitors in the array are electrically coupled with one another.

In some embodiments, a method of forming a memory array, the memory array comprising memory cells individually comprising a transistor and a capacitor, comprises forming vertically-alternating tiers of insulative material and transistor material. The transistor-material tiers individually comprise a first source/drain region and a second source/drain region having a channel region horizontally there-between. A pair of access-line pillars extend elevationally through the vertically-alternating tiers on opposite sides of individual of the channel regions that are in different of the transistor-material tiers. Portions of the access-line pillars in the different transistor-material tiers comprise a pair of gates on the opposite sides of the individual channel regions of individual of the transistors in the different transistor-material tiers. A sense line is formed to electrically couple to multiple of the second source/drain regions. Capacitors individually comprise first and second electrodes having a capacitor insulator there-between. The first electrode is electrically coupled to individual of the first source/drain regions. The second capacitor electrodes of multiple of the capacitors in the array are electrically coupled with one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising vertically-alternating tiers of insulative material and memory cells, the memory cells individually comprising:
 a transistor comprising first and second source/drain regions having a channel region there-between and a gate operatively proximate the channel region, at least a portion of the channel region being horizontally-oriented for horizontal current flow in the portion between the first and second source/drain regions; and
 a capacitor comprising first and second electrodes having a capacitor insulator there-between, the first electrode being electrically coupled to the first source/drain region, the second capacitor electrodes of multiple of the capacitors in the array being electrically coupled with one another;
 a sense line electrically coupled to multiple of the second source/drain regions;
 an access-line pillar extending elevationally through the vertically-alternating tiers, individual ones of the gates of individual ones of the transistors in different ones of the memory-cell tiers comprising a respective portion of the elevationally-extending access-line pillar;
 a capacitor-electrode structure extending elevationally through the vertically-alternating tiers, individual ones of the second electrodes of individual ones of the capacitors being electrically coupled to the elevationally-extending capacitor-electrode structure, the capacitor-electrode structure comprising a wall that is vertically-elongated and horizontally-elongated;
 the individual transistors comprising a gate insulator that is laterally between the gate and the channel region, the gate insulator being laterally between and separating the gate and the first source/drain region from physically contacting one another, the gate insulator being laterally between and separating the gate and the second source/drain region from physically contacting one another; and the first and second source/drain regions each have a vertical side that is directly against both of the channel region and the gate insulator, a greater quantity of each of the vertical sides of the first and second source/drain regions being directly against the gate insulator than is directly against the channel region.

2. The array of claim 1 wherein the channel region comprises two channel-region segments on opposite sides of the gate in a straight-line horizontal cross-section.

3. The array of claim 2 wherein the channel region completely encircles the gate in the straight-line horizontal cross-section.

4. The array of claim 1 wherein the channel region is on only one side of the gate in a straight-line horizontal cross-section.

5. The array of claim 1 wherein the multiple second source/drain regions that are electrically coupled to the sense line are in the same memory-cell tier.

6. The array of claim 5 wherein the sense line is longitudinally-elongated horizontal in that same memory-cell tier.

7. The array of claim 1 comprising another access-line pillar extending elevationally through the vertically-alternating tiers, the another access-line pillar comprising another gate of the individual transistors in the different memory-cell tiers.

8. The array of claim 1 wherein the access-line pillar extends vertically or within 10° of vertical.

9. The array of claim 1 wherein all of the channel region is horizontally-oriented for horizontal current flow there-through.

10. The array of claim 1 wherein the first electrode is directly electrically coupled to the first source/drain region.

11. The array of claim 1 wherein individual ones of the multiple second source/drain regions are directly electrically coupled to the sense line.

12. A method of forming a memory array, the memory array comprising memory cells individually comprising a transistor and a capacitor, the method comprising:
 forming vertically-alternating tiers of insulative material and transistor material; the transistor-material tiers individually comprising a first source/drain region, a second source/drain region, and a channel region horizontally there-between;
 forming insulating material extending elevationally through multiple of the tiers;
 forming a gate opening extending elevationally through the transistor material and the insulative material of the multiple vertically-alternating tiers;
 within the gate opening, forming a gate-insulator annulus and conductive gate material radially inward of the gate-insulator annulus; the conductive gate material extending elevationally through the multiple vertically-alternating tiers, comprising individual ones of the gates of individual ones of the transistors in different ones of the transistor-material tiers, and comprising an access line that interconnects the gates of those individual transistors in the different transistor-material tiers along that access line; the channel region in the individual transistor-material tiers being laterally proximate the gate-insulator annulus and the gate in that individual transistor-material tier;
 forming a horizontally-elongated trench elevationally through the transistor material and the insulative material of the multiple tiers and elevationally into the insulating material;
 within the trench, laterally recessing the transistor material and the insulating material relative to the insulative material to form a horizontally-elongated sense-line trench in the individual transistor-material tiers;
 forming a horizontally-elongated sense line in individual ones of the sense-line trenches in the individual transistor-material tiers, individual ones of the horizontally-elongated sense lines electrically coupling together multiple of the second source/drain regions of multiple individual transistors that are in that transistor-material tier; and
 forming capacitors individually comprising first and second electrodes having a capacitor insulator there-between, the first electrode being electrically coupled to individual ones of the first source/drain regions of individual ones of the multiple individual transistors that are in that transistor-material tier, the second capacitor electrodes of multiple of the capacitors in the array being electrically coupled with one another.

13. The method of claim 12 wherein forming the capacitors comprises:

forming a capacitor opening extending elevationally through the transistor material and the insulative material of the multiple vertically-alternating tiers;

within the capacitor opening, laterally recessing the transistor material to form a first-capacitor-electrode cavity in the individual transistor-material tiers;

forming the first electrode in individual ones of the first-capacitor-electrode cavities in the individual transistor-material tiers;

after forming the first electrode, forming the capacitor insulator in the capacitor opening; and the forming of the second capacitor electrodes comprises forming a capacitor-electrode structure within the capacitor opening radially inward of the capacitor insulator and extending elevationally through the multiple vertically-alternating tiers, the elevationally-extending capacitor-electrode structure comprising the second electrode of the individual capacitors.

14. A memory array comprising vertically-alternating tiers of insulative material and memory cells, the memory cells individually comprising:

a transistor comprising first and second source/drain regions having a channel region there-between and a gate operatively proximate the channel region, at least a portion of the channel region being horizontally-oriented for horizontal current flow in the portion between the first and second source/drain regions; and a capacitor comprising first and second electrodes having a capacitor insulator there-between, the first electrode being electrically coupled to the first source/drain region, the second capacitor electrodes of multiple of the capacitors in the array being electrically coupled with one another;

a sense line electrically coupled to multiple of the second source/drain regions;

an access-line pillar extending elevationally through the vertically-alternating tiers, individual ones of the gates of individual ones of the transistors in different ones of the memory-cell tiers comprising a respective portion of the elevationally-extending access-line pillar;

a capacitor-electrode structure extending elevationally through the vertically-alternating tiers, individual ones of the second electrodes of individual ones of the capacitors being electrically coupled to the elevationally-extending capacitor-electrode structure, the capacitor-electrode structure comprising a wall that is vertically-elongated and horizontally-elongated;

the individual transistors comprising a gate insulator that is laterally between the gate and the channel region, the gate insulator being laterally between and separating the gate and the first source/drain region from physically contacting one another, the gate insulator being laterally between and separating the gate and the second source/drain region from physically contacting one another; and the first and second source/drain regions each have a vertical side that is directly against both of the channel region and the gate insulator, a greater quantity of each of the vertical sides of the first and second source/drain regions being directly against the channel region than is directly against the gate insulator.

15. A memory array comprising vertically-alternating tiers of insulative material and memory cells, the memory cells individually comprising:

a transistor comprising first and second source/drain regions having a channel region there-between and a gate operatively proximate the channel region, at least a portion of the channel region being horizontally-oriented for horizontal current flow in the portion between the first and second source/drain regions; and a capacitor comprising first and second electrodes having a capacitor insulator there-between, the first electrode being electrically coupled to the first source/drain region, the second capacitor electrodes of multiple of the capacitors in the array being electrically coupled with one another;

a sense line electrically coupled to multiple of the second source/drain regions;

an access-line pillar extending elevationally through the vertically-alternating tiers, individual ones of the gates of individual ones of the transistors in different ones of the memory-cell tiers comprising a respective portion of the elevationally-extending access-line pillar;

a capacitor-electrode structure extending elevationally through the vertically-alternating tiers, individual ones of the second electrodes of individual ones of the capacitors being electrically coupled to the elevationally-extending capacitor-electrode structure, the capacitor-electrode structure comprising a wall that is vertically-elongated and horizontally-elongated;

the individual transistors comprising a gate insulator that is laterally between the gate and the channel region, the gate insulator being laterally between and separating the gate and the first source/drain region from physically contacting one another, the gate insulator being laterally between and separating the gate and the second source/drain region from physically contacting one another; and the portion of the elevationally-extending access-line pillar in the individual transistors is completely laterally circumferentially surrounded by a combination of the first source/drain region, the second source/drain region and the channel region; the portion having a first pair of laterally-opposite sides and a second pair of laterally-opposite sides, the channel region being on the laterally-opposite sides of only one of the first or the second pair and not on the laterally-opposite sides of the other of the first pair or the second pair, the first source/drain region and the second source/drain region collectively being on the laterally-opposite sides of only the other of the first or the second pair and not on the laterally-opposite sides of the one of the first pair or the second pair.

16. The array of claim 15 wherein the first and second pairs are orthogonal relative one another.

17. A memory array comprising vertically-alternating tiers of insulative material and memory cells, the memory cells individually comprising:

a transistor comprising first and second source/drain regions having a channel region there-between and a gate operatively proximate the channel region, at least a portion of the channel region being horizontally-oriented for horizontal current flow in the portion between the first and second source/drain regions; and a capacitor comprising first and second electrodes having a capacitor insulator there-between, the first electrode being electrically coupled to the first source/drain region;

a horizontal longitudinally-elongated sense line in individual ones of the memory-cell tiers, individual ones of the second source/drain regions of individual ones of the transistors that are in the same memory-cell tier being electrically coupled to the horizontal longitudinally-elongated sense line in that individual tier of memory cells;

a capacitor-electrode structure extending elevationally through the vertically-alternating tiers, individual ones of the second electrodes of individual ones of the capacitors being electrically coupled to the elevationally-extending capacitor-electrode structure, the capacitor-electrode structure comprising a wall that is vertically-elongated and horizontally-elongated;

an access-line pillar extending elevationally through the vertically-alternating tiers, individual ones of the gates of individual ones of the transistors in different ones of the memory-cell tiers comprising a respective portion of the elevationally-extending access-line pillar;

the individual transistors comprising a gate insulator that is laterally between the gate and the channel region, the gate insulator being laterally between and separating the gate and the first source/drain region from physically contacting one another, the gate insulator being laterally between and separating the gate and the second source/drain region from physically contacting one another; and the first and second source/drain regions each have a vertical side that is directly against both of the channel region and the gate insulator, a greater quantity of each of the vertical sides of the first and second source/drain regions being directly against the gate insulator than is directly against the channel region.

18. A memory array comprising vertically-alternating tiers of insulative material and memory cells, the memory cells individually comprising:

a transistor comprising first and second source/drain regions having a channel region there-between and a gate operatively proximate the channel region, at least a portion of the channel region being horizontally-oriented for horizontal current flow in the portion between the first and second source/drain regions; and a capacitor comprising first and second electrodes having a capacitor insulator there-between, the first electrode being electrically coupled to the first source/drain region;

a horizontal longitudinally-elongated sense line in individual ones of the memory-cell tiers, individual ones of the second source/drain regions of individual ones of the transistors that are in the same memory-cell tier being electrically coupled to the horizontal longitudinally-elongated sense line in that individual tier of memory cells;

a capacitor-electrode structure extending elevationally through the vertically-alternating tiers, individual ones of the second electrodes of individual of individual ones of the capacitors being electrically coupled to the elevationally-extending capacitor-electrode structure, the capacitor-electrode structure comprising a wall that is vertically-elongated and horizontally-elongated;

an access-line pillar extending elevationally through the vertically-alternating tiers, individual ones of the gates of individual ones of the transistors in different ones of the memory-cell tiers comprising a respective portion of the elevationally-extending access-line pillar;

the individual transistors comprising a gate insulator that is laterally between the gate and the channel region, the gate insulator being laterally between and separating the gate and the first source/drain region from physically contacting one another, the gate insulator being laterally between and separating the gate and the second source/drain region from physically contacting one another; and the first and second source/drain regions each have a vertical side that is directly against both of the channel region and the gate insulator, a greater quantity of each of the vertical sides of the first and second source/drain regions being directly against the channel region than is directly against the gate insulator.

19. A memory array comprising vertically-alternating tiers of insulative material and memory cells, the memory cells individually comprising:

a transistor comprising first and second source/drain regions having a channel region there-between and a gate operatively proximate the channel region, at least a portion of the channel region being horizontally-oriented for horizontal current flow in the portion between the first and second source/drain regions; and a capacitor comprising first and second electrodes having a capacitor insulator there-between, the first electrode being electrically coupled to the first source/drain region;

a horizontal longitudinally-elongated sense line in individual ones of the memory-cell tiers, individual ones of the second source/drain regions of individual ones of the transistors that are in the same memory-cell tier being electrically coupled to the horizontal longitudinally-elongated sense line in that individual tier of memory cells;

a capacitor-electrode structure extending elevationally through the vertically-alternating tiers, individual ones of the second electrodes of individual ones of the capacitors being electrically coupled to the elevationally-extending capacitor-electrode structure, the capacitor-electrode structure comprising a wall that is vertically-elongated and horizontally-elongated;

an access-line pillar extending elevationally through the vertically-alternating tiers, individual ones of the gates of individual ones of the transistors in different ones of the memory-cell tiers comprising a respective portion of the elevationally-extending access-line pillar;

the individual transistors comprising a gate insulator that is laterally between the gate and the channel region, the gate insulator being laterally between and separating the gate and the first source/drain region from physically contacting one another, the gate insulator being laterally between and separating the gate and the second source/drain region from physically contacting one another; and the portion of the elevationally-extending access-line pillar in the individual transistors is completely laterally circumferentially surrounded by a combination of the first source/drain region, the second source/drain region and the channel region; the portion having a first pair of laterally-opposite sides and a second pair of laterally-opposite sides, the channel region being on the laterally-opposite sides of only one of the first or the second pair and not on the laterally-opposite sides of the other of the first pair or the second pair, the first source/drain region and the second source/drain region collectively being on the laterally-opposite sides of only the other of the first or the second pair and not on the laterally-opposite sides of the one of the first pair or the second pair.

20. The array of claim 19 wherein the first and second pairs are orthogonal relative one another.

21. A memory array comprising vertically-alternating tiers of insulative material and memory cells, the memory cells individually comprising:
- a transistor comprising first and second source/drain regions having a channel region there-between and a gate operatively proximate the channel region, at least a portion of the channel region being horizontally-oriented for horizontal current flow in the portion between the first and second source/drain regions; and
- a capacitor comprising first and second electrodes having a capacitor insulator there-between, the first electrode being electrically coupled to the first source/drain region, the second capacitor electrodes of multiple of the capacitors in the array being electrically coupled with one another;
- a sense line electrically coupled to multiple of the second source/drain regions;
- an access-line pillar extending elevationally through the vertically-alternating tiers, individual ones of the gates of individual ones of the transistors in different ones of the memory-cell tiers comprising a respective portion of the elevationally-extending access-line pillar;
- the individual transistors comprising a gate insulator that is laterally between the gate and the channel region, the gate insulator being laterally between and separating the gate and the first source/drain region from physically contacting one another, the gate insulator being laterally between and separating the gate and the second source/drain region from physically contacting one another; and
- the first and second source/drain regions each have a vertical side that is directly against both of the channel region and the gate insulator, a greater quantity of each of the vertical sides of the first and second source/drain regions being directly against the gate insulator than is directly against the channel region.

22. A memory array comprising vertically-alternating tiers of insulative material and memory cells, the memory cells individually comprising:
- a transistor comprising first and second source/drain regions having a channel region there-between and a gate operatively proximate the channel region, at least a portion of the channel region being horizontally-oriented for horizontal current flow in the portion between the first and second source/drain regions; and
- a capacitor comprising first and second electrodes having a capacitor insulator there-between, the first electrode being electrically coupled to the first source/drain region, the second capacitor electrodes of multiple of the capacitors in the array being electrically coupled with one another;
- a sense line electrically coupled to multiple of the second source/drain regions;
- an access-line pillar extending elevationally through the vertically-alternating tiers, individual ones of the gates of individual ones of the transistors in different ones of the memory-cell tiers comprising a respective portion of the elevationally-extending access-line pillar;
- the individual transistors comprising a gate insulator that is laterally between the gate and the channel region, the gate insulator being laterally between and separating the gate and the first source/drain region from physically contacting one another, the gate insulator being laterally between and separating the gate and the second source/drain region from physically contacting one another; and
- the first and second source/drain regions each have a vertical side that is directly against both of the channel region and the gate insulator, a greater quantity of each of the vertical sides of the first and second source/drain regions being directly against the channel region than is directly against the gate insulator.

23. A memory array comprising vertically-alternating tiers of insulative material and memory cells, the memory cells individually comprising:
- a transistor comprising first and second source/drain regions having a channel region there-between and a gate operatively proximate the channel region, at least a portion of the channel region being horizontally-oriented for horizontal current flow in the portion between the first and second source/drain regions; and
- a capacitor comprising first and second electrodes having a capacitor insulator there-between, the first electrode being electrically coupled to the first source/drain region, the second capacitor electrodes of multiple of the capacitors in the array being electrically coupled with one another;
- a sense line electrically coupled to multiple of the second source/drain regions;
- an access-line pillar extending elevationally through the vertically-alternating tiers, individual ones of the gates of individual ones of the transistors in different ones of the memory-cell tiers comprising a respective portion of the elevationally-extending access-line pillar; and
- the portion of the elevationally-extending access-line pillar in the individual transistors being completely laterally circumferentially surrounded by a combination of the first source/drain region, the second source/drain region and the channel region; the portion having a first pair of laterally-opposite sides and a second pair of laterally-opposite sides, the channel region being on the laterally-opposite sides of only one of the first or the second pair and not on the laterally-opposite sides of the other of the first pair or the second pair, the first source/drain region and the second source/drain region collectively being on the laterally-opposite sides of only the other of the first or the second pair and not on the laterally-opposite sides of the one of the first pair or the second pair.

24. The array of claim 23 wherein the first and second pairs are orthogonal relative one another.

* * * * *